(12) United States Patent
Nakai

(10) Patent No.: US 10,972,102 B2
(45) Date of Patent: Apr. 6, 2021

(54) INTERFACE CIRCUIT

(71) Applicant: Mitsubishi Electric Corporation, Tokyo (JP)

(72) Inventor: Takayuki Nakai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/319,879

(22) PCT Filed: Sep. 20, 2016

(86) PCT No.: PCT/JP2016/077661
§ 371 (c)(1),
(2) Date: Jan. 23, 2019

(87) PCT Pub. No.: WO2018/055666
PCT Pub. Date: Mar. 29, 2018

(65) Prior Publication Data
US 2019/0267999 A1 Aug. 29, 2019

(51) Int. Cl.
*H03K 19/0185* (2006.01)
*H03K 19/0175* (2006.01)

(52) U.S. Cl.
CPC . *H03K 19/018521* (2013.01); *H03K 19/0175* (2013.01)

(58) Field of Classification Search
CPC ....... H03K 19/0175; H03K 19/017509; H03K 19/0185; H03K 19/018507; H03K 19/018521
See application file for complete search history.

(56) References Cited

U.S. PATENT DOCUMENTS

| | | | | |
|---|---|---|---|---|
| 6,498,738 B1 * | 12/2002 | Orita | ............ | H03K 19/018521 363/73 |
| 7,215,149 B1 * | 5/2007 | Andrews | .......... | H03K 3/356104 326/81 |
| 7,808,294 B1 * | 10/2010 | Kottapalli | ........ | H03K 3/356113 327/333 |

(Continued)

FOREIGN PATENT DOCUMENTS

| JP | 1152817 A | 6/1989 |
|---|---|---|
| JP | 2007101740 A | 4/2007 |

(Continued)

OTHER PUBLICATIONS

International Search Report (PCT/ISA/210) dated Dec. 13, 2016, by the Japan Patent Office as the International Searching Authority for International Application No. PCT/JP2016/077661.

*Primary Examiner* — Jason Crawford
(74) *Attorney, Agent, or Firm* — Buchanan Ingersoll & Rooney PC

(57) ABSTRACT

An interface circuit serves to receive an input signal VIN having a high level defined as a high potential VIH and a low level defined as a low potential VIL, and output an output signal VOUT having a high level defined as a high potential VOH and a low level defined as a low potential VOL. The interface circuit includes a polarity controller configured to control the output signal VOUT to be in phase in level with the input signal VIN or to be reversed in polarity with respect to the input signal VIN, depending on whether the high potential VIH or the low potential VIL is a GND potential.

21 Claims, 12 Drawing Sheets

(56) References Cited

U.S. PATENT DOCUMENTS

| | | | |
|---|---|---|---|
| 2002/0047740 A1* | 4/2002 | Suzuki | H02M 3/07 327/333 |
| 2006/0164147 A1* | 7/2006 | Nomura | H03K 19/018521 327/333 |
| 2009/0153193 A1* | 6/2009 | Aranovsky | H03K 19/018521 326/90 |
| 2011/0006809 A1* | 1/2011 | Takenaka | H03K 3/35613 326/80 |
| 2011/0204921 A1 | 8/2011 | Yamaguchi | |
| 2012/0223760 A1* | 9/2012 | Uchino | H03K 19/018521 327/333 |
| 2013/0021084 A1* | 1/2013 | Sreenivasaiah | H03K 19/017509 327/333 |
| 2015/0263731 A1* | 9/2015 | Kushiyama | H03K 19/0185 327/333 |
| 2015/0346742 A1* | 12/2015 | Kapoor | G06F 1/32 327/540 |
| 2017/0012627 A1* | 1/2017 | Kapoor | G06F 1/3234 |
| 2018/0069537 A1* | 3/2018 | Kamimaru | H03K 3/356165 |
| 2018/0123590 A1* | 5/2018 | Yagishita | H03K 19/018528 |

FOREIGN PATENT DOCUMENTS

| | | |
|---|---|---|
| JP | 2011019017 A | 1/2011 |
| JP | 2011103557 A | 5/2011 |
| JP | 2011176767 A | 9/2011 |

* cited by examiner

INTERFACE CIRCUIT

TECHNICAL FIELD

The present invention relates to an interface circuit configured to convert an input signal into another signal level and output the converted signal.

BACKGROUND ART

In recent years, the operating voltage for an electronic component has been acceleratingly diversified. For example, a control signal generated by a digital integrated circuit (IC) operated at 3.3V, such as a microcomputer and a field programmable gate array (FPGA) may be supplied to an element to be controlled, such as a high withstand voltage element and a high frequency element. In this case, the level of the control signal needs to be converted into a high voltage such as several tens of voltages or a negative voltage before it is supplied to the element to be controlled. Thus, an interface circuit including the so-called level conversion circuit is used.

Japanese Patent Laying-Open Nos. 2007-101740 (PTD 1), 2011-19017 (PTD 2), H01-152817 (PTD 3), 2011-103557 (PTD 4), and 2011-176767 (PTD 5) disclose various level conversion circuits.

CITATION LIST

Patent Literature

PTL 1: Japanese Patent Laying-Open No. 2007-101740
PTL 2: Japanese Patent Laying-Open No. 2011-19017
PTL 3: Japanese Patent Laying-Open No. H01-152817
PTL 4: Japanese Patent Laying-Open No. 2011-103557
PTL 5: Japanese Patent Laying-Open No. 2011-176767

SUMMARY OF INVENTION

Technical Problem

In most cases, a power supply of 3.3V on the high potential side and 0V on the low potential side (a ground potential: hereinafter referred to as a GND potential) is supplied to a digital IC. In this case, the digital IC outputs a high active control signal at a high level defined as 3.3V and a low level defined as a GND potential equivalent to inactive (non-active).

On the other hand, due to constraints of power supply configurations of products, there may be a case where a power supply of a GND potential on the high potential side and −3.3V on the low potential side is supplied to a digital IC. In this case, the digital IC outputs a low active control signal at a high level defined as a GND potential equivalent to inactive and a low level defined as −3.3V.

Furthermore, assuming that the potential of the received control signal on the opposite side of the reference potential (for example, a GND potential) equivalent to inactive is defined as active (significant), the element to be controlled operates when the control signal is in the active state in order to prevent an unintentional operation at power-up.

Also the element to be controlled operates in most cases by the control signal of a high level defined as an active state (high active). It is to be noted that there is also an element to be controlled that operates by the control signal of a low level defined as an active state (low active). When the reference potential equivalent to inactive is a GND potential, the high level corresponds to a positive potential in a high active state while the low level corresponds to a negative potential in a low active state.

Accordingly, an interface circuit configured to receive a control signal from a digital IC as an input and to output a control signal for controlling an element to be controlled needs to be designed as appropriate in consideration whether the control signal is high active or low active.

For example, as an interface circuit between: a digital IC configured to output a high active control signal having a high level of 3.3V and a low level of a GND potential; and an element to be controlled that operates with a high active control signal, a circuit configured to output a signal in phase with the control signal received from the digital IC to the element to be controlled is selected.

As an interface circuit between: a digital IC configured to output a low active control signal having a high level of a GND potential and a low level of −3.3V; and an element to be controlled that operates with a high active control signal, a circuit configured to output a signal reversed in polarity with respect to the control signal received from the digital IC to the element to be controlled is selected.

In this way, an interface circuit used for an element to be controlled that operates with a high active control signal needs to be selected as appropriate depending on whether the control signal received from the digital IC is high active or low active.

Similarly, as an interface circuit between: a digital IC configured to output a high active control signal having a high level of 3.3V and a low level of a GND potential; and an element to be controlled that operates with a low active control signal, a circuit configured to output a signal reversed in polarity with respect to the control signal received from the digital IC to the element to be controlled is selected.

As an interface circuit between: a digital IC configured to output a low active control signal having a high level of a GND potential and a low level of −3.3V; and an element to be controlled that operates with a low active control signal, a circuit configured to output a signal in phase with the control signal received from the digital IC to the element to be controlled is selected.

In this way, an interface circuit used for an element to be controlled that operates with a low active control signal needs to be selected as appropriate depending on whether the control signal output from the digital IC is high active or low active.

As described above, it is necessary to appropriately redesign an interface circuit according to the input control signal, which causes a problem of increasing development costs.

The above-mentioned patent documents each disclose a level conversion circuit, but fail to take into consideration the above-described problem.

The present invention has been made to solve the above-described problems. An object of the present invention is to provide an interface circuit capable of outputting a desired signal irrespective of whether the input signal is high active or low active.

Solution to Problem

An interface circuit of the present invention is configured to: (i) receive a first signal that has a high level defined as a first potential and a low level defined as a second potential lower than the first potential; and (ii) output a second signal that has a high level defined as a third potential and a low level defined as a fourth potential lower than the third potential. The interface circuit includes a controller.

The controller is configured to control the second signal to be in phase with the first signal or to be reversed in polarity with respect to the first signal, depending on whether the first potential or the second potential is a first reference potential.

Advantageous Effects of Invention

According to the present invention, a desired signal can be output irrespective of whether the input signal is high active or low active.

DESCRIPTION OF EMBODIMENTS

Before describing embodiments of the present invention, Comparative Example 1 and Comparative Example 2 with respect to the present invention will be hereinafter described. In the following description, the state where a signal a and a signal b are in phase with each other means that when signal a is at a high level, signal b is also at a high level, and when signal a is at a low level, signal b is also at a low level. Furthermore, the state where signal a is reversed in polarity with respect to signal b means that when signal a is at a high level, signal b is at a low level, and when signal a is at a low level, signal b is at a high level.

Comparative Example 1

Figure 1:
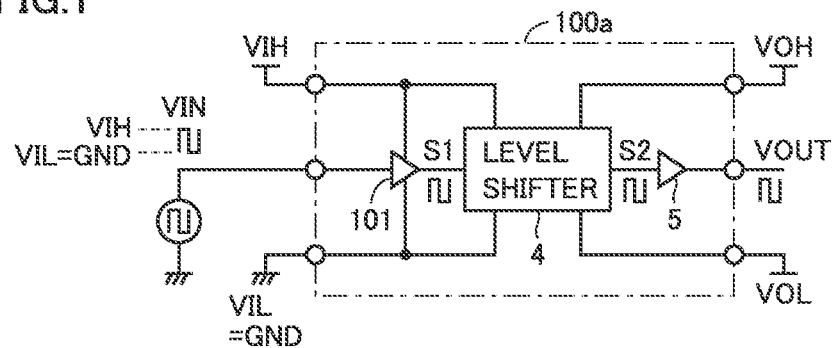
FIG. 1 is a circuit block diagram showing the configuration of an interface circuit according to Comparative Example 1.

FIG. 1 is a circuit block diagram showing the configuration of an interface circuit 100a according to Comparative Example 1. Interface circuit 100a serves to: receive an input signal VIN having a high level defined as a high potential VIH and a low level defined as a low potential VIL; and output an output signal VOUT having a high level defined as a high potential VOH and a low level defined as a low potential VOL. As shown in FIG. 1, interface circuit 100a includes an input buffer 101, a level shifter 4, and an output buffer 5.

Input buffer 101 receives high potential VIH and low potential VIL from an input-side power supply. When input signal VIN is at a high level, input buffer 101 outputs a signal S1 of high potential VIH to level shifter 4. When input signal YIN is at a low level, input buffer 101 outputs signal S1 of low potential VIL to level shifter 4. In this way, input buffer 101 outputs signal S1 in phase with input signal VIN.

Level shifter 4 receives high potential VIH and low potential VIL from the input-side power supply, and receives high potential VOH and low potential VOL from the output-side power supply. Level shifter 4 receives signal S1 output from input buffer 101, and outputs a signal S2 that is in phase with signal S1 and converted in level from signal S1. Level shifter 4 may receive only high potential VIH from the input-side power supply.

Specifically, when signal S1 received from input buffer 101 is at a high level, level shifter 4 outputs signal S2 of high potential VOH. When signal S1 is at a low level, level shifter 4 outputs signal S2 of low potential VOL.

In this way, level shifter 4 outputs signal S2 that is in phase with signal S1 output from input buffer 101. In other words, level shifter 4 outputs signal S2 that is in phase with input signal VIN and converted in level.

Output buffer 5 receives signal S2 output from level shifter 4, and outputs a signal in phase with signal S2 as output signal VOUT. In other words, output buffer 5 outputs a signal in phase with input signal VIN as output signal VOUT. Output buffer 5 amplifies the current of output signal VOUT so as to obtain a current required for the output current to drive a load.

In this way, interface circuit 100a outputs output signal VOUT in phase with input signal VIN. Thus, interface circuit 100a is suitable, for example, as a circuit configured to: receive, from a digital IC, a high active signal having a high level of 3.3V and a low level of a GND potential equivalent to inactive as input signal VIN; and output the output signal VOUT to an element to be controlled that operates with a high active control signal.

However, in the case where interface circuit 100a receives, from a digital IC, a low active signal having a high level of a GND potential equivalent to inactive and a low level of −3.3V as input signal VIN, interface circuit 100a outputs output signal VOUT at a high level when input signal VIN is at a GND potential equivalent to inactive. Thus, interface circuit 100a is not suitable as a circuit that receives a low active signal as input signal VIN and outputs output signal VOUT to an element to be controlled that operates with a high active control signal.

Comparative Example 2

Figure 2:
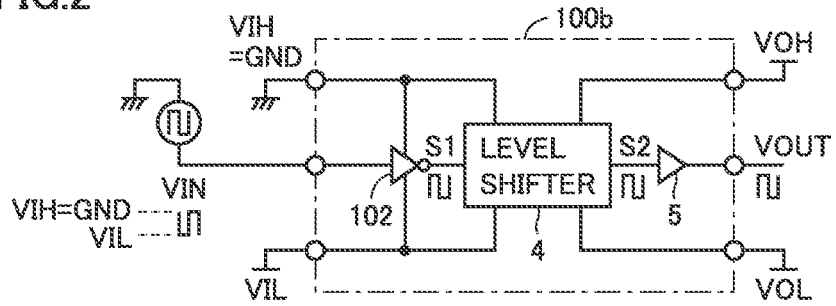
FIG. 2 is a circuit block diagram showing the configuration of an interface circuit according to Comparative Example 2.

FIG. 2 is a circuit block diagram showing the configuration of an interface circuit 100b according to Comparative Example 2. Interface circuit 100b is different from interface circuit 100a shown in FIG. 1 in that it includes an input inverter 102 in place of input buffer 101.

Input inverter 102 receives a high potential VIH and a low potential VIL from the input-side power supply. When input signal VIN is at a high level, input inverter 102 outputs signal S1 of low potential VIL to level shifter 4. When input signal YIN is at a low level, input inverter 102 outputs signal S1 of high potential VIH to level shifter 4. In this way, input inverter 102 outputs signal S1 reversed in polarity with respect to input signal VIN.

As described in Comparative Example 1, level shifter 4 outputs signal S2 in phase with signal S1 received from the preceding stage. Similarly, output buffer 5 also outputs output signal VOUT in phase with signal S2 received from the preceding stage. Thus, interface circuit 100b outputs output signal VOUT reversed in polarity with respect to input signal VIN.

Thereby, interface circuit 100b is suitable, for example, as a circuit configured to receive, from a digital IC, a low active control signal having a high level of a GND potential equivalent to inactive and a low level of −3.3V as input signal VIN, and to output an output signal VOUT to an element to be controlled that operates with a high active control signal.

However, when interface circuit 100b receives, from a digital IC, a high active signal having a high level of 3.3V and a low level of a GND potential equivalent to inactive as input signal VIN, interface circuit 100b outputs an output signal VOUT at a high level when input signal VIN is at a GND potential equivalent to inactive. Accordingly, interface circuit 100b is not suitable as a circuit configured to receive a high active signal as input signal VIN and to output an output signal VOUT to an element to be controlled that operates with a high active control signal.

Thus, in Comparative Examples 1 and 2, depending on whether input signal VIN is high active or low active (in other words, depending on whether the high level or the low level of input signal VIN corresponds to a reference potential (for example, a GND potential) equivalent to inactive), the user needs to choose which one of interface circuit 100a and interface circuit 100b to be used as an interface circuit configured to output an output signal VOUT to the element to be controlled that operates with a high active control signal.

In contrast, the interface circuit according to the embodiment of the present invention can be used irrespective of whether input signal VIN is high active or low active. The embodiments of the present invention will be hereinafter described in detail with reference to the accompanying drawings, in which the same or corresponding components are designated by the same reference characters, and description thereof will not be repeated.

First Embodiment (Configuration of Interface Circuit)

Figure 3:
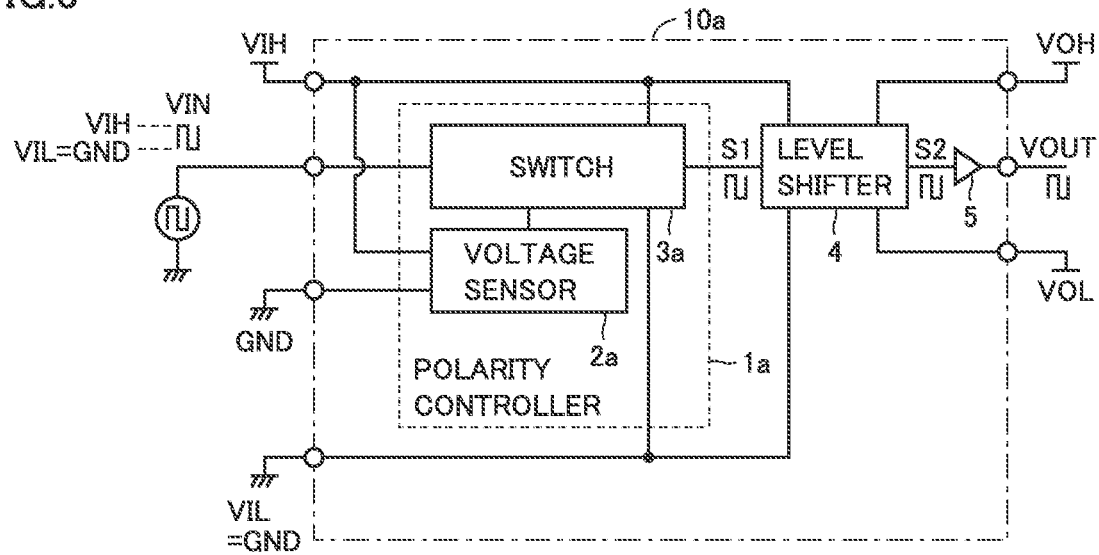
FIG. 3 is a circuit block diagram showing the configuration of an interface circuit according to the first embodiment, in the case where a signal having a high level defined as a positive potential and a low level defined as a GND potential is received as an input signal VIN.
Figure 4:
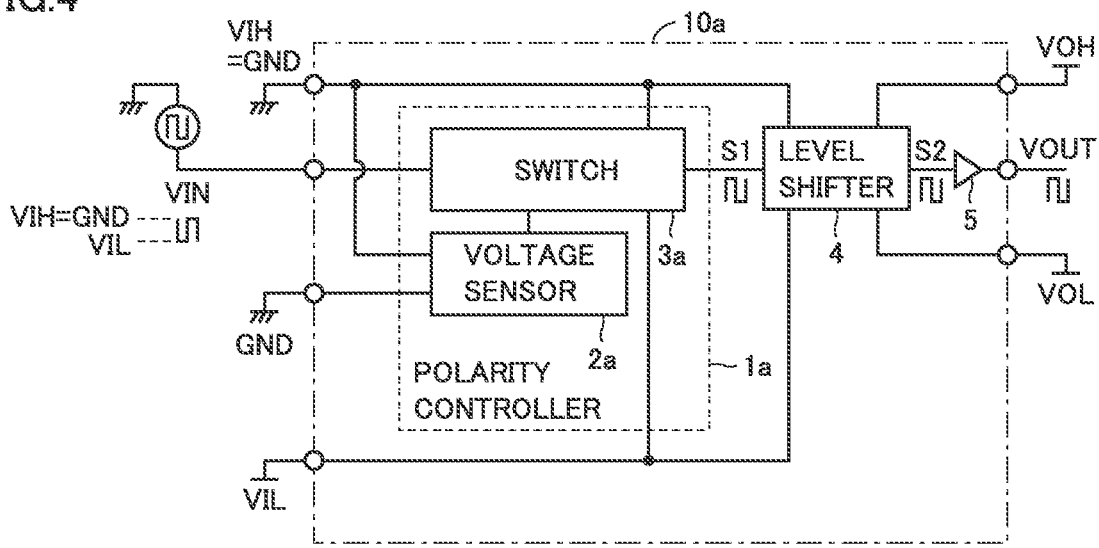
FIG. 4 is a circuit block diagram showing the configuration of the interface circuit according to the first embodiment, in the case where a signal having a high level defined as a GND potential and a low level defined as a negative potential is received as input signal VIN.

FIGS. 3 and 4 each are a circuit block diagram showing the configuration of an interface circuit 10a according to the first embodiment. FIG. 3 shows the case of receiving, as input signal VIN, a high active signal having a high level (high potential VIH) as a positive potential and a low level (low potential VIL) as a reference potential (in this case, a GND potential) equivalent to inactive. FIG. 4 shows the case of receiving, as input signal VIN, a signal having a high level as a reference potential (in this case, a GND potential) equivalent to inactive and a low level as a negative potential. The configuration of interface circuit 10a is the same in FIGS. 3 and 4.

Interface circuit 10a serves to output high active output signal VOUT irrespective of whether the high level or the low level of input signal VIN corresponds to a GND potential. Thus, interface circuit 10a is applicable as a circuit configured to output an output signal VOUT to an element to be controlled that operates with a high active control signal.

As shown in FIGS. 3 and 4, interface circuit 10a is different from interface circuit 100a shown in FIG. 1 or interface circuit 100b shown in FIG. 2 in that it includes a polarity controller 1a in place of input buffer 101 or input inverter 102.

Depending on whether the GND potential (the first reference potential) as a reference potential equivalent to inactive corresponds to a high level or a low level of input signal VIN, polarity controller 1a controls signal S1 to be output such that this signal S1 is in phase with input signal VIN or this signal S1 is reversed in polarity with respect to input signal VIN. Specifically, polarity controller 1a controls signal S1 to be output such that (i) this signal S1 is in phase with input signal VIN when the GND potential corresponds to the low level of input signal VIN, and (ii) this signal S1 is reversed in polarity with respect to the level of input signal VIN when the GND potential corresponds to the high level of input signal VIN.

Polarity controller 1a includes a voltage sensor 2a and a switch 3a as internal components thereof, for example.

Voltage sensor 2a receives a GND potential as a reference potential equivalent to inactive and also receives high potential VIH from the input-side power supply. Then, voltage sensor 2a compares the CND potential and high potential VIH. When the difference between high potential VIH and the GND potential is smaller than a threshold value, voltage sensor 2a outputs, to switch 3a, a sensing signal showing that high potential VIH is a GND potential. When the difference between high potential VIH and the GND potential is equal to or greater than the threshold value, voltage sensor 2a outputs, to switch 3a, a sensing signal showing that low potential VIL is a GND potential.

Switch 3a receives input signal VIN. Then, according to the sensing signal from voltage sensor 2a, switch 3a switches signal S1 to be in phase with input signal VIN or to be reversed.

Specifically, when the sensing signal shows that low potential VIL is a GND potential, switch 3a outputs signal S1 in phase with input signal VIN to level shifter 4. When the sensing signal shows that high potential VIH is a GND potential, switch 3a outputs signal S1 reversed in polarity with respect to input signal VIN to level shifter 4. Switch 3a receives high potential VIH and low potential VIL from the input-side power supply, and outputs signal S1 having a high level as high potential VIH and a low level as low potential VIL.

Level shifter 4 having received signal S1 output from switch 3a outputs signal S2 that is in phase with the received signal S1 and that has a high level as high potential VOH and a low level as low potential VOL, as in Comparative Examples 1 and 2.

In this case, high potential VOH is an active state potential at which a driven state is controlled to occur in an element to be controlled that receives output signal VOUT from interface circuit 10a. On the other hand, low potential VOL is a potential (for example, a GND potential) at which a driven state does not occur in an element to be controlled. Thus, output buffer 5 having received the signal output from level shifter 4 outputs high active output signal VOUT.

As shown in FIG. 3, when receiving high active input signal VIN having a high level (high potential VIH) as a positive potential and a low level (low potential VIL) as a GND potential equivalent to inactive, voltage sensor 2a outputs a sensing signal showing that low potential VIL is a GND potential. Accordingly, switch 3a outputs signal S1 in phase with input signal VIN. Level shifter 4 and output buffer 5 each output a signal that is equal in polarity to signal S1 output from switch 3a. Thus, input signal VIN and output signal VOUT are in phase with each other.

On the other hand, as shown in FIG. 4, when receiving a low active input signal VIN having a high level (high potential VIH) as a GND potential equivalent to inactive and a low level (low potential VIL) as a negative potential, voltage sensor 2a outputs a sensing signal showing that high potential VIH is a GND potential. Accordingly, switch 3a outputs signal S1 reversed in polarity with respect to input signal VIN. Level shifter 4 and output buffer 5 each output a signal in phase with signal S1 output from switch 3a. Thus, the polarity of output signal VOUT is reversed with respect to input signal VIN.

In this way, interface circuit 10a receives input signal YIN (the first signal) having a high level as high potential VIH (the first potential) and a low level as low potential VIL (the second potential). Also, interface circuit 10a outputs output signal VOUT (the second signal) having a high level as high potential VOH (the third potential) and a low level as low potential VOL (the fourth potential).

Interface circuit 10a includes polarity controller 1a configured to control output signal VOUT to be in phase with input signal VIN or to be reversed in polarity with respect to input signal VIN, depending on whether high potential VIH or low potential VIL is a reference potential (for example, a GND potential) equivalent to inactive.

Thereby, irrespective of whether input signal VIN is high active or low active (that is, irrespective of whether the high level or the low level of input signal VIN is a GND potential equivalent to inactive), output signal VOUT can be set at one of a high level and a low level when input signal YIN is at a GND potential, and can be set at the other of a high level and a low level when input signal VIN is not at a GND potential. As a result, irrespective of whether input signal VIN is high active or low active, desired output signal VOUT can be output.

Particularly, in the first embodiment, when low potential VIL is a reference potential (for example, a GND potential) equivalent to inactive, polarity controller 1a outputs signal S1 (the third signal) in phase with input signal VIN. Also, when high potential VIH is this reference potential (for example, a GND potential), polarity controller 1a outputs signal S1 reversed in polarity with respect to input signal YIN.

Furthermore, interface circuit 10a includes: level shifter 4 configured to receive signal S1 and output signal S2 (the second signal) having a high level as high potential VOH and a low level as low potential VOL, signal S2 being in phase with signal S1; and output buffer 5 configured to perform current-amplification of signal S2 and output an output signal VOUT.

Thereby, a high active output signal VOUT can be output, irrespective of whether input signal VIN is high active or low active.

(Example of Interface Circuit)
(Circuit Configuration of Polarity Controller)

Figure 5:
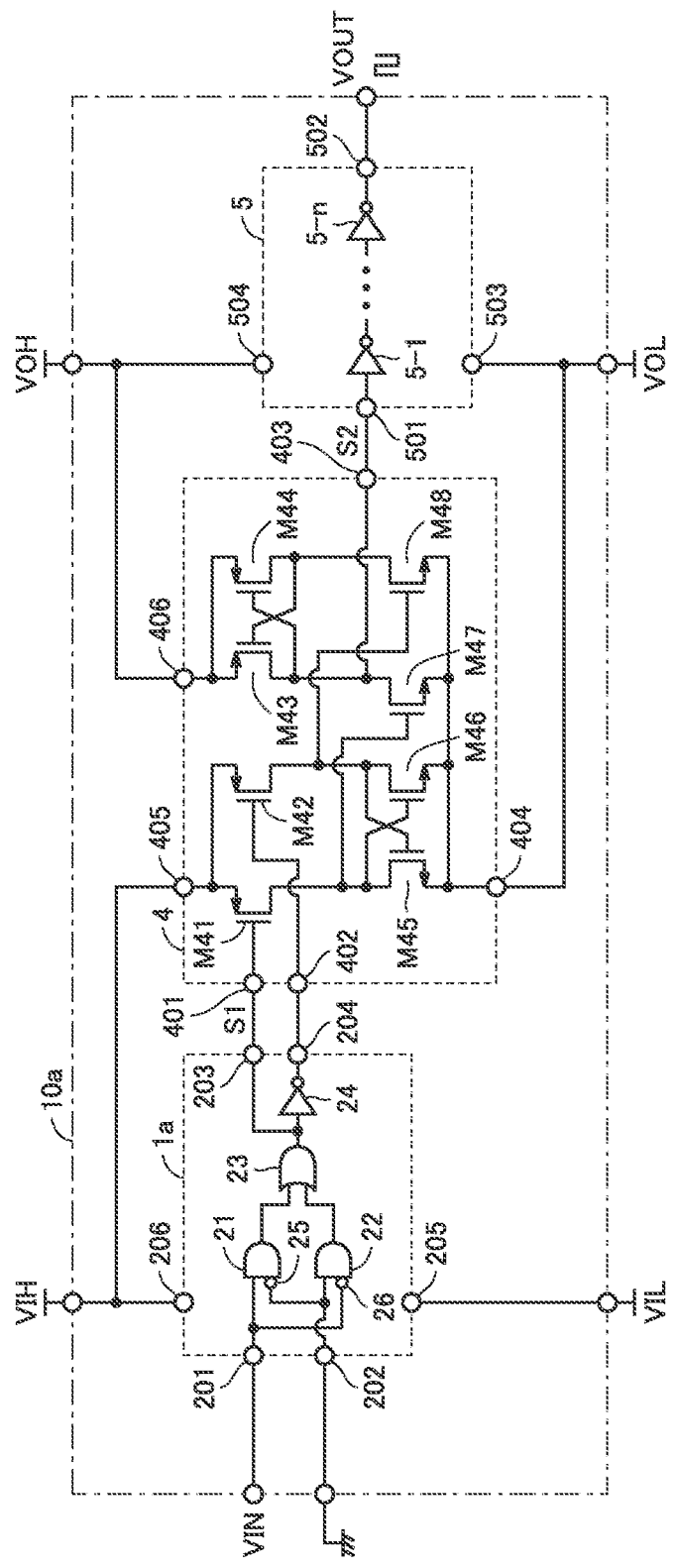
FIG. 5 is a circuit diagram showing an example of the interface circuit according to the first embodiment.

FIG. 5 is a circuit diagram showing an example of interface circuit 10a. As shown in FIG. 5, polarity controller 1a includes, for example, two input terminals 201, 202, two output terminals 203, 204, two power supply terminals 205, 206, two AND circuits 21, 22, three inverters 24, 25, 26, and an OR circuit 23.

Input terminal 201 receives input signal VIN. Input terminal 202 is grounded and receives a GND potential as a reference potential. Power supply terminal 205 is connected to the low-potential side of an input-side power supply and receives low potential VIL. Power supply terminal 206 is connected to the high-potential side of the input-side power supply and receives high potential VIH.

AND circuit 21 has one input terminal directly connected to input terminal 201. AND circuit 21 has the other input terminal connected to input terminal 202 through inverter 25.

AND circuit 22 has one input terminal directly connected to input terminal 202. AND circuit 22 has the other input terminal connected to input terminal 201 through inverter 26.

OR circuit 23 has one input terminal connected to the output terminal of AND circuit 21. OR circuit 23 has the other input terminal connected to the output terminal of AND circuit 22. OR circuit 23 has an output terminal connected to output terminal 203. Thus, the signal from OR circuit 23 is output as signal S1 from polarity controller 1a.

Inverter 24 has an input terminal connected to the output terminal of OR circuit 23. Inverter 24 has an output terminal connected to output terminal 204. Thus, the signal inverted from the signal from OR circuit 23 is output from output terminal 204.

(Operation of Polarity Controller)

Figure 6:
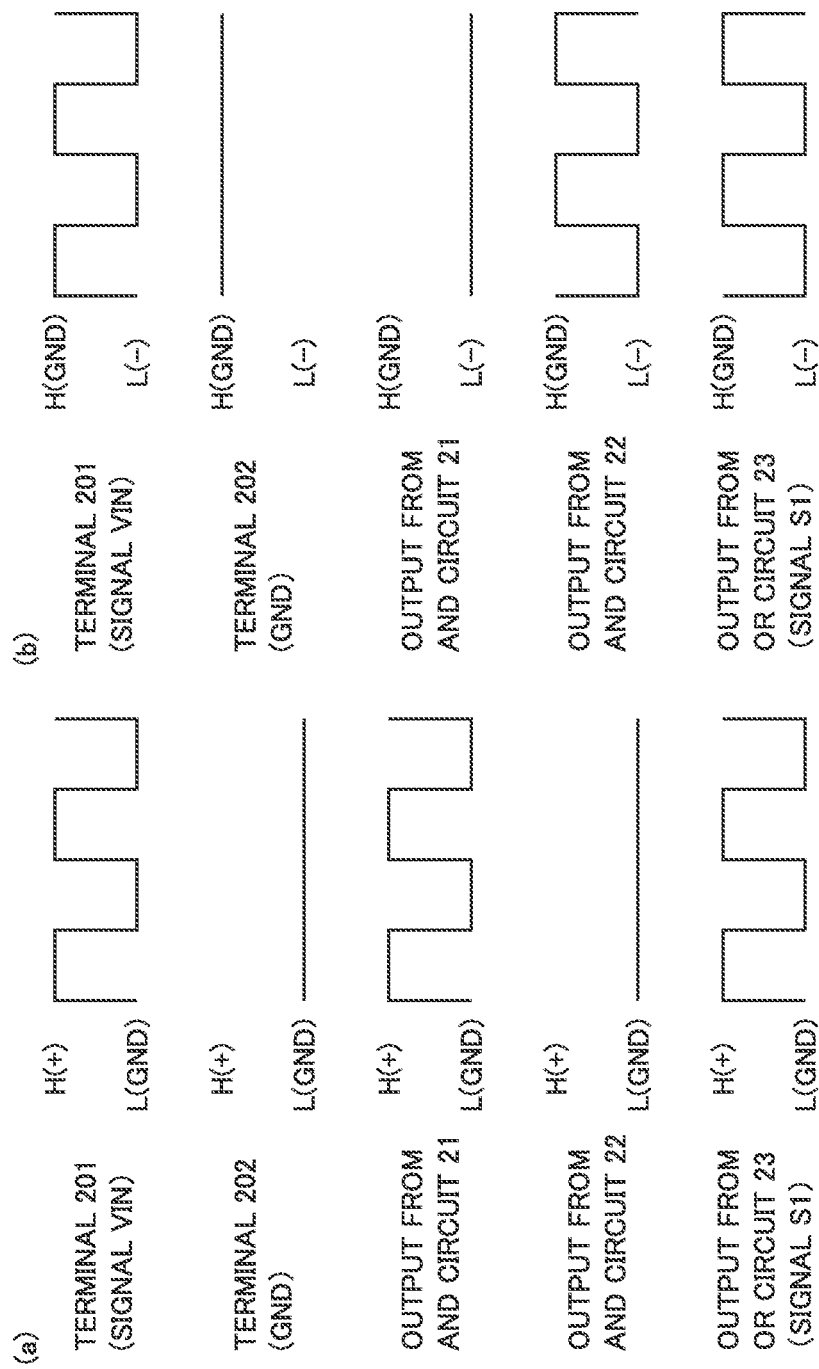
FIG. 6 is a signal waveform diagram showing a change in a potential state of each of terminals in the interface circuit shown in FIG. 5.

FIG. 6 shows signal waveform diagrams showing changes in the potential states of: input terminal 201; input terminal 202; the output terminal of AND circuit 21; the output terminal of AND circuit 22; and the output terminal (output terminal 203) of OR circuit 23.

FIG. 6(*a*) shows the case of receiving input signal VIN having a high level (high potential VIH) as a positive potential and a low level (low potential VIL) as a GND potential. Each logic circuit in polarity controller 1a receives high potential VIH and low potential VIL from the input-side power supply. Accordingly, AND circuit 22 recognizes, as a low level, the potential at the input terminal that is directly connected to input terminal 202 to which a GND potential is applied. Thereby, AND circuit 22 consistently outputs a low-level signal.

On the other hand, AND circuit 21 recognizes, as a high level, the potential at the input terminal connected to input terminal 202 through inverter 25. Also, input signal VIN is input into the input terminal of AND circuit 21 that is directly connected to input terminal 201. Consequently, as shown in FIG. 6(a), AND circuit 21 outputs a signal in phase with input signal VIN input into input terminal 201.

Thereby, OR circuit 23 outputs, as signal S1, a signal in phase with input signal VIN input into input terminal 201.

FIG. 6(b) shows the case of receiving input signal VIN having a high level (high potential VIH) as a GND potential and a low level (low potential VIL) as a negative potential. Each logic circuit in polarity controller 1a receives high potential VIH and low potential VIL from the input-side power supply. Accordingly, AND circuit 22 recognizes, as a high level, the potential at the input terminal directly connected to input terminal 202 to which a GND potential is applied. Furthermore, a signal inverted from input signal VIN is input into the input terminal of AND circuit 22 that is connected to input terminal 201 through inverter 26. Thus, as shown in FIG. 6(b), AND circuit 22 outputs a signal inverted from input signal VIN that is input into input terminal 201.

On the other hand, AND circuit 21 recognizes, as a low level, the potential applied to the input terminal connected to input terminal 202 through inverter 25. Thus, AND circuit 21 consistently outputs a low-level signal.

Thereby, OR circuit 23 outputs, as signal S1, a signal inverted from input signal VIN that is input into input terminal 201.

In this way, irrespective of whether the high level or the low level of input signal VIN is a GND potential, polarity controller 1a having the circuit configuration shown in FIG. 5 can output, from output terminal 203, signal S1 attaining a low level in the state where input signal VIN is at a GND potential and attaining a high level in the state where input signal VIN is not at a GND potential.

(Circuit Configuration of Level Shifter)

As shown in FIG. 5, level shifter 4 includes: two input terminals 401, 402; an output terminal 403; three power supply terminals 404 to 406; four PMOS transistors (P-channel type metal oxide semiconductor field effect transistor: PMOSFET (P-type field effect transistor)) M41, M42, M43, M44; and four NMOS transistors (N-channel type metal oxide semiconductor field effect transistor: NMOSFET: (N-type field effect transistor)) M45, M46, M47, M48.

Input terminal 401 is connected to output terminal 203 of polarity controller 1a. Input terminal 402 is connected to output terminal 204 of polarity controller 1a.

Power supply terminal 405 is connected to the high potential side of the input-side power supply and receives high potential VIH. Power supply terminal 406 is connected to the high potential side of the output-side power supply and receives high potential VOH. Power supply terminal 404 is connected to the low potential side of the output-side power supply and receives low potential VOL.

PMOS transistor M41 and PMOS transistor M42 each has a source connected to power supply terminal 405 (high potential VIH). PMOS transistor M41 has a gate connected to input terminal 401. PMOS transistor M42 has a gate connected to input terminal 402.

NMOS transistor M45 and NMOS transistor M46 each have a source connected to power supply terminal 404 (low potential VOL). The gate of NMOS transistor M45 is connected to the drain of NMOS transistor M46 while the gate of NMOS transistor M46 is connected to the drain of NMOS transistor M45. In other words, NMOS transistor M45 and NMOS transistor M46 are cross-coupled to each other.

The drains of PMOS transistor M41 and the NMOS transistor M45 are connected to each other. The drains of PMOS transistor M42 and NMOS transistor M46 are connected to each other.

PMOS transistor M43 and PMOS transistor M44 each have a source connected to power supply terminal 406 (high potential VOH). The gate of PMOS transistor M43 is connected to the drain of PMOS transistor M44 while the gate of PMOS transistor M44 is connected to the drain of PMOS transistor M43. In other words, PMOS transistor M43 and PMOS transistor M44 are cross-coupled to each other.

NMOS transistor M47 and NMOS transistor M48 each have a source connected to power supply terminal 404 (low potential VOL). NMOS transistor M47 has a gate connected to the drains of PMOS transistor M41 and NMOS transistor M45. NMOS transistor M48 has a gate connected to the drains of PMOS transistor M42 and NMOS transistor M46.

The drains of PMOS transistor M43 and NMOS transistor M47 are connected to each other. The drains of PMOS transistor M44 and NMOS transistor M48 are connected to each other. Furthermore, the drains of PMOS transistor M43 and NMOS transistor M47 are connected to output terminal 403.

(Operation of Level Shifter: When S1 is at High Level)

The operation of level shifter 4 having a circuit configuration shown in FIG. 5 will be hereinafter described. First, an explanation will be given with regard to the case where signal S1 output from output terminal 203 is at a high level (high potential VIH). In this case, input terminal 401 receives a signal of high potential VIH, and input terminal 402 receives a signal of low potential VIL. Thereby, low potential VIL is applied to the gate of PMOS transistor M42, so that conduction occurs between the source and the drain of PMOS transistor M42.

When conduction occurs between the source and the drain of PMOS transistor M42, high potential VIH is applied to the gate of NMOS transistor M48, so that conduction occurs between the source and the drain of NMOS transistor M48. Thereby, low potential VOL is applied to the gate of PMOS transistor M43, so that conduction occurs between the source and the drain of PMOS transistor M43. As a result, signal S2 of high potential VOH is output from output terminal 403.

When the signal received by input terminal 401 is at a high level (high potential VIH), conduction occurs between the source and the drain of PMOS transistor M42. Thus, high potential VIH is applied to the gate of NMOS transistor M45, so that conduction occurs between the source and the drain of NMOS transistor M45. Since high potential VIH is applied to the gate of PMOS transistor M41, no conduction occurs between the source and the drain of PMOS transistor M41. Thus, the potentials at the drains of PMOS transistor M41 and NMOS transistor M45 are kept at low potential VOL.

Furthermore, since low potential VOL is applied to the gate of NMOS transistor M46 connected to the drain of NMOS transistor M45, no conduction occurs between the source and the drain of NMOS transistor M46. Since conduction occurs between the source and the drain of PMOS transistor M42 as described above, the potentials at the drains of PMOS transistor M42 and NMOS transistor M46 are kept at high potential VIH.

Furthermore, since low potential VOL is applied also to the gate of NMOS transistor M47 connected to the drain of NMOS transistor M45, no conduction occurs between the source and the drain of NMOS transistor M47. Since conduction occurs between the source and the drain of PMOS transistor M43 as described above, the potentials at the drains of PMOS transistor M43 and NMOS transistor M47 are kept at high potential VOH.

Furthermore, since conduction occurs between the source and the drain of PMOS transistor M43, high potential VIH is applied to the gate of PMOS transistor M44, so that no conduction occurs between the source and the drain of PMOS transistor M44. Since conduction occurs between the source and the drain of NMOS transistor M48 as described above, the potentials at the drains of PMOS transistor M44 and NMOS transistor M48 are kept at low potential VOL.

In this way, when signal S1 output from output terminal 203 is at a high level (that is, when input terminal 401 receives a signal at a high level), the potentials at the drains of PMOS transistor M43 and NMOS transistor M47 are kept at high potential VOH. Accordingly, signal S2 of high potential VOH is output from output terminal 403 connected to these drains.

(Operation of Level Shifter: When S1 is at Low Level)

Then, an explanation will be given with regard to the case where the signal output from output terminal 203 is at a low level (low potential VIL). In this case, input terminal 401 receives a signal of low potential VIL, and input terminal 402 receives a signal of high potential VIH. Accordingly, low potential VIL is applied to the gate of PMOS transistor M41, so that conduction occurs between the source and the drain of PMOS transistor M41.

When conduction occurs between the source and the drain of PMOS transistor M41, high potential VIH is applied to the gate of NMOS transistor M47, so that conduction occurs between the source and the drain of NMOS transistor M47. Thereby, signal S2 of low potential VOL is output from output terminal 403.

Since conduction occurs between the source and the drain of PMOS transistor M41, high potential VIH is applied also to the gate of NMOS transistor M46, so that conduction occurs between the source and the drain of NMOS transistor M46. Furthermore, when signal S1 output from output terminal 203 is at low potential VIL, the signal output from output terminal 204 is at high potential VIH. Accordingly, no conduction occurs between the source and the drain of PMOS transistor M42 having the gate connected to output terminal 204. Thus, the potentials at the drains of PMOS transistor M42 and NMOS transistor M46 are kept at low potential VOL.

Since the potential at the drain of NMOS transistor M46 is low potential VOL, no conduction occurs between the source and the drain of NMOS transistor M45 having the gate connected to the drain of NMOS transistor M46. Since conduction occurs between the source and the drain of PMOS transistor M41 as described above, the potentials at the drains of PMOS transistor M41 and NMOS transistor M45 are kept at high potential VIH.

Furthermore, no conduction occurs also between the source and the drain of NMOS transistor M48 having the gate connected to the drain (low potential VOL) of NMOS transistor M46. Since conduction occurs between the source and the drain of NMOS transistor M47 as described above, low potential VOL is applied to the gate of PMOS transistor M44, so that conduction occurs between the source and the drain of PMOS transistor M44. Accordingly, the potentials at the drains of PMOS transistor M44 and NMOS transistor M48 are kept at high potential VOH.

Since the potential at the drain of PMOS transistor M44 is high potential VOH, no conduction occurs between the source and the drain of PMOS transistor M43 having the gate connected to the drain of PMOS transistor M44. Since conduction occurs between the source and the drain of NMOS transistor M47 as described above, the potentials at the drains of PMOS transistor M43 and NMOS transistor M47 are kept at low potential VOL.

In this way, when signal S1 output from output terminal 203 is at a low level (that is, when input terminal 401 receives a low-level signal), the potentials at the drains of PMOS transistor M43 and NMOS transistor M47 are kept at low potential VOL. Accordingly, signal S2 of low potential VOL is output from output terminal 403 connected to these drains.

As described above, when level shifter 4 receives signal S1 at a high level, level shifter 4 outputs signal S2 of high potential VOH from output terminal 403. When level shifter 4 receives signal S1 at a low level, level shifter 4 outputs signal S2 of low potential VOL from output terminal 403. In other words, level shifter 4 outputs signal S2 that is in phase with signal S1 input into input terminal 401, and that has a high level shifted to high potential VOH and a low level shifted to low potential VOL.

(Circuit Configuration of Output Buffer)

Output buffer 5 includes: an input terminal 501 into which signal S2 is input from level shifter 4; an output terminal 502; two power supply terminals 503, 504; and CMOS inverters 5-1 to 5-$n$ ($n$ is a positive even number) in even number stages.

Power supply terminal 503 is connected to the low potential side of the output-side power supply and receives low potential VOL. Power supply terminal 504 is connected to the high potential side of the output-side power supply and receives high potential VOH.

CMOS inverters 5-1 to 5-$n$ each perform current-amplification of signal S2 from level shifter 4 so as to obtain a current required to drive the load in the rear stage of interface circuit 10$a$, and then outputs an output signal VOUT from output terminal 502.

In this way, in the example of interface circuit 10$a$ shown in FIG. 5, polarity controller 1$a$ outputs signal S1 in phase with input signal VIN when low potential VIL is a GND potential, and outputs signal S1 reversed in polarity with respect to input signal VIN when high potential VIH is a GND potential. Then, level shifter 4 outputs signal S2 in phase with signal S1. Output buffer 5 outputs an output signal VOUT in phase with signal S2. Thereby, irrespective of whether the GND potential as a reference potential equivalent to inactive corresponds to the high level or the low level of input signal VIN, interface circuit 10$a$ can output high active output signal VOUT.

Second Embodiment (Configuration of Interface Circuit)

Figure 7:
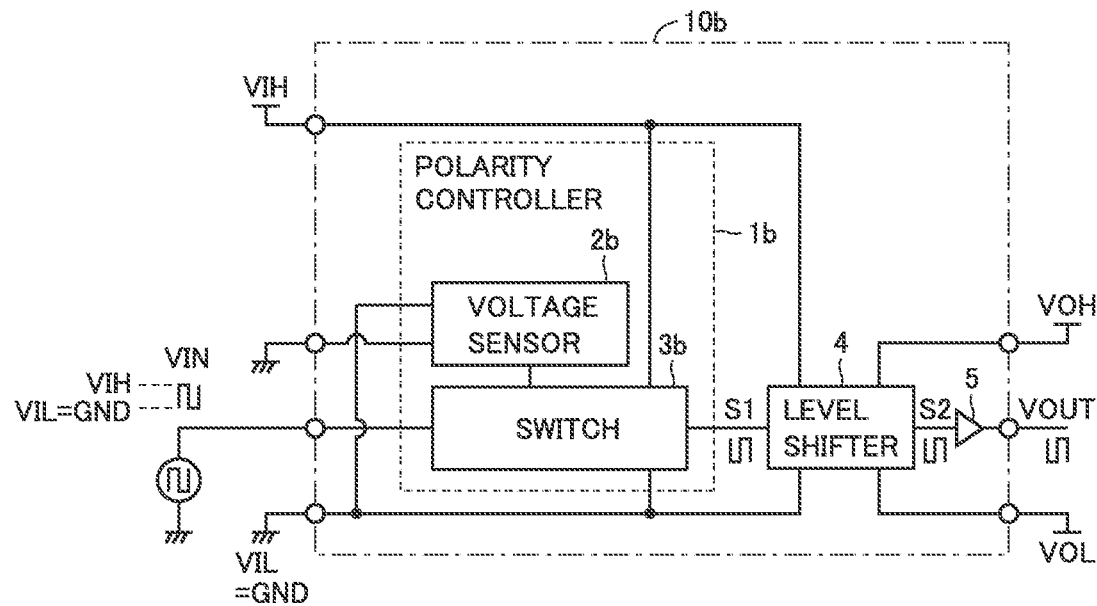
FIG. 7 is a circuit block diagram showing the configuration of an interface circuit according to the second embodiment, in the case where a signal having a high level defined as a positive potential and a low level defined as a GND potential is received as an input signal VIN.
Figure 8:
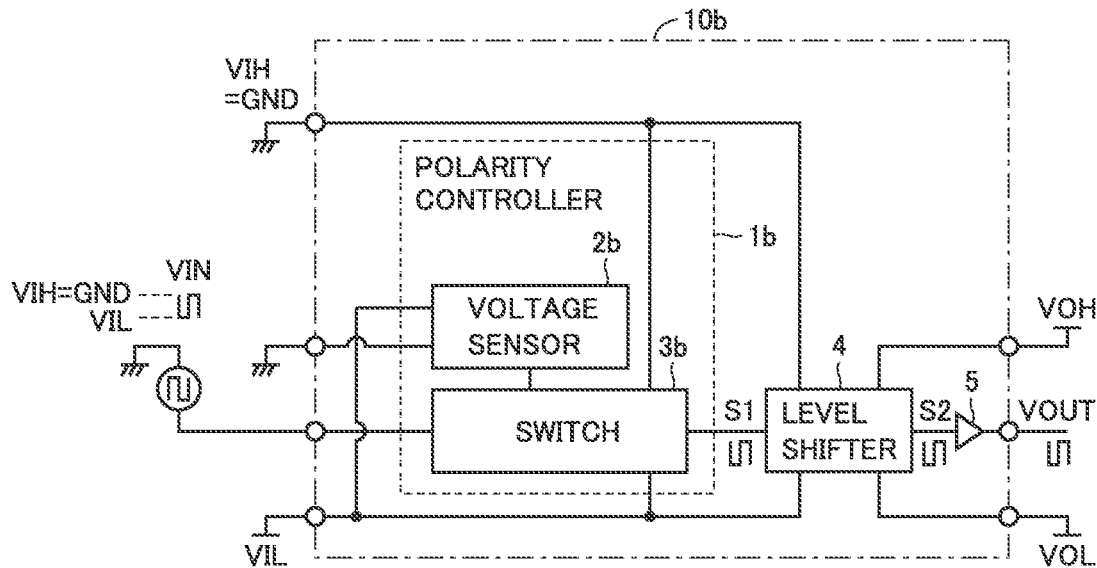
FIG. 8 is a circuit block diagram showing the configuration of the interface circuit according to the second embodiment, in the case where a signal having a high level defined as a GND potential and a low level defined as a negative potential is received as input signal VIN.

FIGS. 7 and 8 each are a circuit block diagram showing the configuration of an interface circuit 10$b$ according to the second embodiment. FIG. 7 shows the case of receiving, as input signal VIN, a high active signal having a high level (high potential VIH) as a positive potential and a low level (low potential VIL) as a reference potential (in this case, a GND potential) equivalent to inactive. FIG. 8 shows the case of receiving, as input signal VIN, a low active signal having a high level as a GND potential and a low level as a negative potential. The configuration of interface circuit 10b itself is the same in FIGS. 7 and 8.

Irrespective of whether the high level or the low level of input signal VIN is at a GND potential, interface circuit 10b serves to output a low active output signal VOUT. Accordingly, interface circuit 10b is applicable as a circuit that outputs an output signal VOUT to an element to be controlled that operates with a low active control signal.

As shown in FIGS. 7 and 8, interface circuit 10b is different from interface circuit 10a shown in each of FIGS. 3 and 4 in that it includes a polarity controller 1b in place of polarity controller 1a.

Depending on whether the GND potential as a reference potential equivalent to inactive corresponds to the high level or the low level of input signal VIN, polarity controller 1b controls output signal S1 to be in phase with input signal VIN or to be reversed in polarity with respect to input signal VIN. Specifically, when the GND potential corresponds to the high level of input signal VIN, polarity controller 1b controls the output signal S1 to be in phase with input signal VIN. When the GND potential corresponds to the low level of input signal VIN, polarity controller 1b controls the output signal S1 to be reversed in polarity with respect to input signal VIN.

Polarity controller 1b includes a voltage sensor 2b and a switch 3b as internal components thereof, for example.

Voltage sensor 2b receives a GND potential as a reference potential equivalent to inactive, and receives low potential VIL from the input-side power supply. Then, voltage sensor 2b compares these potentials with each other. When the difference between low potential VIL and the GND potential is smaller than a threshold value, voltage sensor 2b outputs, to switch 3b, a sensing signal showing that low potential VIL is a GND potential. When the difference between low potential VIL and the GND potential is equal to or greater than the threshold value, voltage sensor 2b outputs, to switch 3b, a sensing signal showing that high potential VIH is a GND potential.

In response to receipt of input signal YIN, switch 3b switches signal S1 to be in phase with input signal YIN or to be inverted, according to the sensing signal from voltage sensor 2b.

Specifically, when the sensing signal shows that high potential VIH is a GND potential, switch 3b outputs signal S1 in phase with input signal VIN to level shifter 4. When the sensing signal shows that low potential VIL is a GND potential, switch 3b outputs signal S1 reversed in polarity with respect to input signal VIN to level shifter 4. Upon reception of high potential VIH and low potential VIL from the input-side power supply, switch 3b sets signal S1 to be high potential VIH at its high level and to be low potential VIL at its low level.

Level shifter 4 having received signal S1 output from switch 3b outputs signal S2 that is in phase with the received signal S1, that has a high level as high potential VOH and a low level as low potential VOL, as in the first embodiment.

In this case, low potential VOL is an active state potential at which a driven state is controlled to occur in an element to be controlled that receives output signal VOUT from interface circuit 10b. On the other hand, high potential VOH is a potential (for example, a GND potential) at which a driven state does not occur in an element to be controlled.

Accordingly, output buffer 5 having received the signal output from level shifter 4 outputs a low active output signal VOUT.

As shown in FIG. 7, when receiving high active input signal VIN having a high level (high potential VIH) as a positive potential and a low level (low potential VIL) as a GND potential equivalent to inactive, voltage sensor 2b outputs a sensing signal showing that low potential VIL is a GND potential. Thus, switch 3b outputs signal S1 that is reversed in polarity with respect to input signal VIN. Level shifter 4 and output buffer 5 each output a signal in phase with signal S1 output from switch 3b. Accordingly, the polarity of output signal VOUT is reversed with respect to input signal VIN.

On the other hand, as shown in FIG. 8, when receiving low active input signal VIN having a high level (high potential VIH) as a GND potential equivalent to inactive and a low level (low potential VIL) as a negative potential, voltage sensor 2b outputs a sensing signal showing that high potential VIH is a GND potential. Thus, switch 3b outputs signal S1 in phase with input signal VIN. Level shifter 4 and output buffer 5 each output a signal in phase with signal S1 output from switch 3b. Accordingly, input signal VIN and output signal VOUT are in phase with each other.

In this way, interface circuit 10b includes polarity controller 1b configured to: output signal S1 in phase with input signal VIN when high potential VIH is a reference potential (for example, a GND potential) equivalent to inactive; and output signal S1 reversed in polarity with respect to input signal VIN when low potential VIL is a GND potential. Level shifter 4 and output buffer 5 each output a signal in phase with signal S1.

Thereby, irrespective of whether input signal VIN is high active or low active (that is, irrespective of whether the high level or the low level of input signal VIN is a GND potential equivalent to inactive), a low active output signal VOUT can be output.

(Example of Interface Circuit)
(Circuit Configuration of Polarity Controller)

Figure 9:
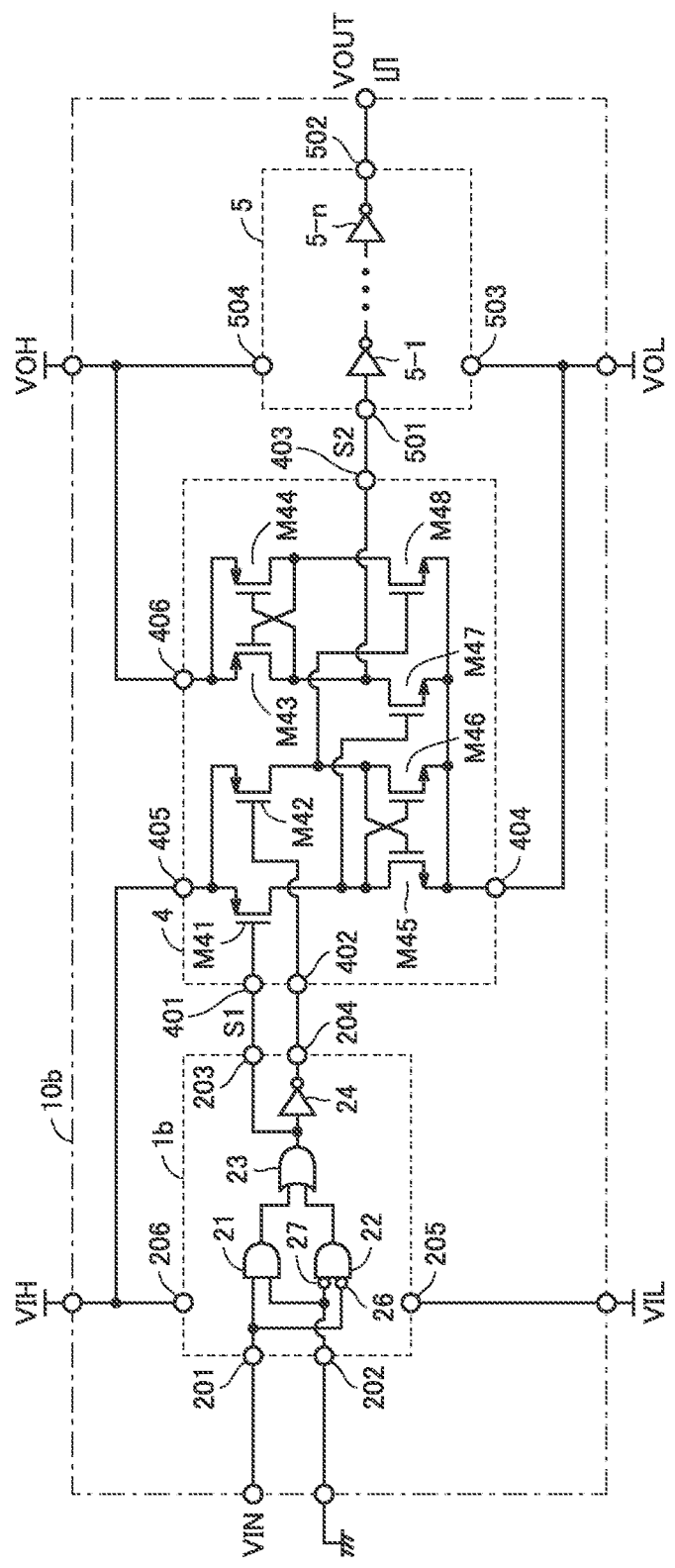
FIG. 9 is a circuit diagram showing an example of the interface circuit according to the second embodiment.

FIG. 9 is a circuit diagram showing an example of interface circuit 10b. Interface circuit 10b in the example shown in FIG. 9 is different from interface circuit 10a in the example shown in FIG. 5 in that it includes a polarity controller 1b in place of polarity controller 1a.

The example of polarity controller 1b shown in FIG. 9 is different from the example of polarity controller 1a shown in FIG. 5 only in that it includes an inverter 27 in place of inverter 25.

Specifically, AND circuit 21 has two input terminals each directly connected to a corresponding one of input terminals 201 and 202. One input terminal of AND circuit 22 is connected to input terminal 202 through inverter 27, and the other input terminal of AND circuit 22 is connected to input terminal 201 through inverter 26.

(Operation of Polarity Controller)

Figure 10:
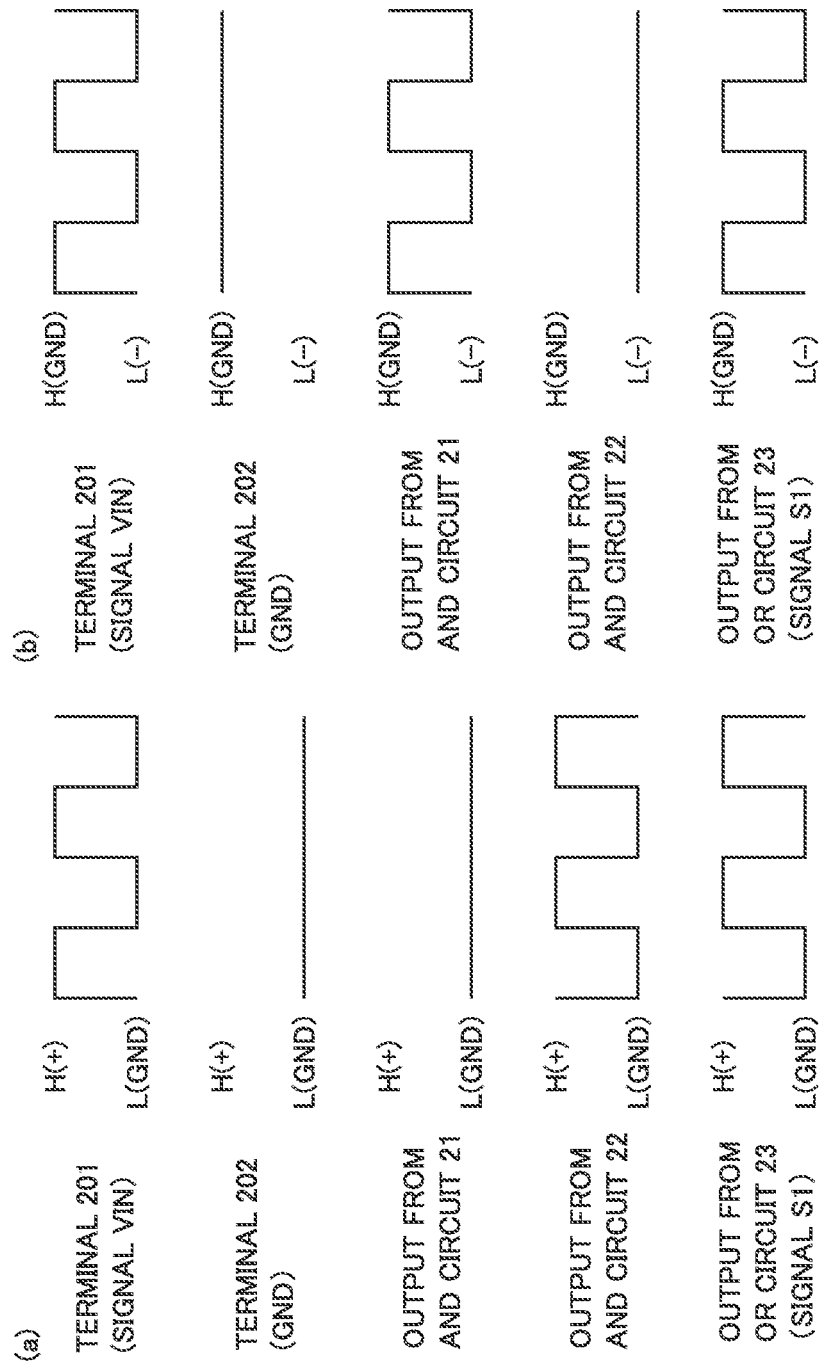
FIG. 10 is a signal waveform diagram showing a change in a potential state of each of terminals in the interface circuit shown in FIG. 9.

FIG. 10 shows signal waveform diagrams showing changes in the potential states of: input terminal 201; input terminal 202; the output terminal of AND circuit 21; the output terminal of AND circuit 22; and the output terminal (output terminal 203) of OR circuit 23, in the example of polarity controller 1b shown in FIG. 9.

FIG. 10(a) shows the case of receiving input signal VIN having a high level (high potential VIH) as a positive potential and a low level (low potential VIL) as a GND potential. Each logic circuit in polarity controller 1b receives high potential VIH and low potential VIL from the input-side power supply. Accordingly, AND circuit 21 recognizes, as a low level, the potential at the input terminal directly connected to input terminal 202 into which a GND potential is input. Thus, AND circuit 21 consistently outputs a low-level signal.

On the other hand, AND circuit 22 recognizes, as a high level, the potential at the input terminal connected to input terminal 202 through inverter 27. Furthermore, a signal inverted from input signal VIN is input into the input terminal of AND circuit 22 that is connected to input terminal 201 through inverter 26. Accordingly, as shown in FIG. 10(*a*), AND circuit 22 outputs a signal inverted from input signal VIN input into input terminal 201.

Thereby, OR circuit 23 outputs, as signal S1, a signal inverted from input signal VIN input into input terminal 201.

FIG. 10(*b*) shows the case of receiving input signal VIN having a high level (high potential VIH) as a GND potential and a low level (low potential VIL) as a negative potential. Each logic circuit in polarity controller 1*b* receives high potential VIE and low potential VIL from the input-side power supply. Accordingly, AND circuit 21 recognizes, as a high level, the potential at the input terminal directly connected to input terminal 202 to which a GND potential is applied. Furthermore, input signal VIN is input into the input terminal of AND circuit 21 that is directly connected to input terminal 201. Thus, as shown in FIG. 10(*b*), AND circuit 21 outputs, as signal S1, the signal in phase with input signal VIN input into input terminal 201.

On the other hand, AND circuit 22 recognizes, as a low level, the potential at the input terminal connected to input terminal 202 through inverter 27. Thus, AND circuit 22 consistently outputs a low-level signal.

Thereby, OR circuit 23 outputs, as signal S1, the signal in phase with input signal VIN input into input terminal 201.

In this way, irrespective of whether the high level or the low level of input signal VIN is at a GND potential, polarity controller 1*b* having the circuit configuration shown in FIG. 9 can output, from output terminal 203, the signal attaining a high level when input signal VIN is at a GND potential and attaining a low level when input signal VIN is not at a GND potential.

Level shifter 4 shown in FIG. 9 has the same circuit configuration as shown in FIG. 5, and outputs signal S2 in phase with signal S1. Output buffer 5 shown in FIG. 9 also has the same circuit configuration as shown in FIG. 5, and outputs output signal VOUT in phase with signal S2. Thereby, irrespective of whether the GND potential as a reference potential equivalent to inactive corresponds to a high level or a low level of input signal VIN, interface circuit 10*b* can output low active output signal VOUT Third Embodiment (Configuration of Interface Circuit)

Interface circuit 10*a* according to the above-described first embodiment operates in response to receipt of high potential VIH and low potential VIL from the input-side power supply. In contrast, the interface circuit according to the third embodiment receives high potential VIH from the input-side power supply, and generates a potential corresponding to low potential VIL from high potential VIH on the inside thereof. Accordingly, it is not necessary to receive low potential VIL from the input-side power supply.

Figure 11:
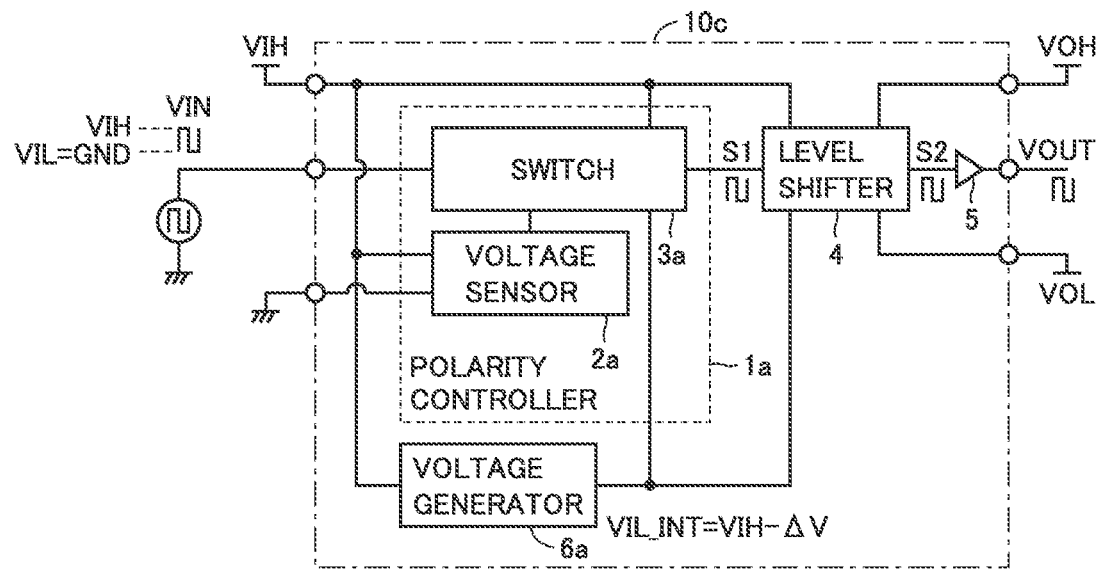
FIG. 11 is a circuit block diagram showing the configuration of an interface circuit according to the third embodiment, in the case where a signal having a high level defined as a positive potential and a low level defined as a GND potential is received as an input signal VIN.
Figure 12:
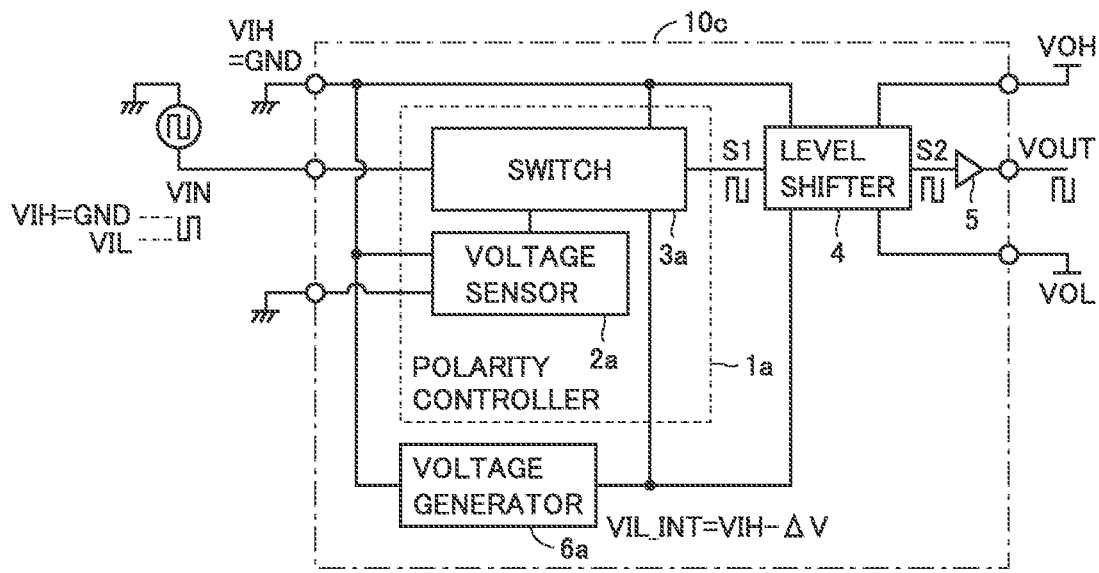
FIG. 12 is a circuit block diagram showing the configuration of the interface circuit according to the third embodiment, in the case where a signal having a high level defined as a GND potential and a low level defined as a negative potential is received as input signal VIN.

FIGS. 11 and 12 each are a circuit block diagram showing the configuration of an interface circuit 10*c* according to the third embodiment. FIG. 11 shows the case of receiving, as input signal VIN, a high active signal having a high level (high potential VIH) as a positive potential and a low level (low potential VIL) as a reference potential (in this case, a GND potential) equivalent to inactive. FIG. 12 shows the case of receiving, as input signal VIN, a low active signal having a high level as a GND potential and a low level as a negative potential. The configuration of interface circuit 10*c* itself is the same in FIGS. 11 and 12.

Irrespective of whether the high level or the low level of input signal VIN is a GND potential, interface circuit 10*c* serves to output high active output signal VOUT, as in interface circuit 10*a* in the first embodiment. Accordingly, interface circuit 10*c* is applicable as a circuit that outputs an output signal VOUT to an element to be controlled that operates with a high active control signal.

As shown in FIGS. 11 and 12, interface circuit 10*c* is different from interface circuit 10*a* shown in FIGS. 3 and 4 in that it does not receive low potential VIL from the input-side power supply and includes a voltage generator 6*a*.

Voltage generator 6*a* generates a potential VIL_INT that is reduced by a prescribed voltage ΔV from high potential VIH, and outputs the generated potential VIL_INT to polarity controller 1*a* and level shifter 4 as a potential on the low potential side.

Voltage ΔV is approximately equal to the difference between high potential VIH and low potential VIL (VIH−VIL) of input signal VIN. Voltage ΔV is set at a voltage at which switching can be sufficiently achieved in polarity controller 1*a* and level shifter 4 that receive potential VIL_INT as a potential on the low potential side.

According to the above-described configuration, high potential VIH is input into interface circuit 10*c*, but low potential VIL does not need to be input thereinto. Accordingly, the number of terminals in interface circuit 10*c* can be reduced, so that the substrate forming interface circuit 10*c* can be reduced in size.

(Example of Interface Circuit)

Figure 13:
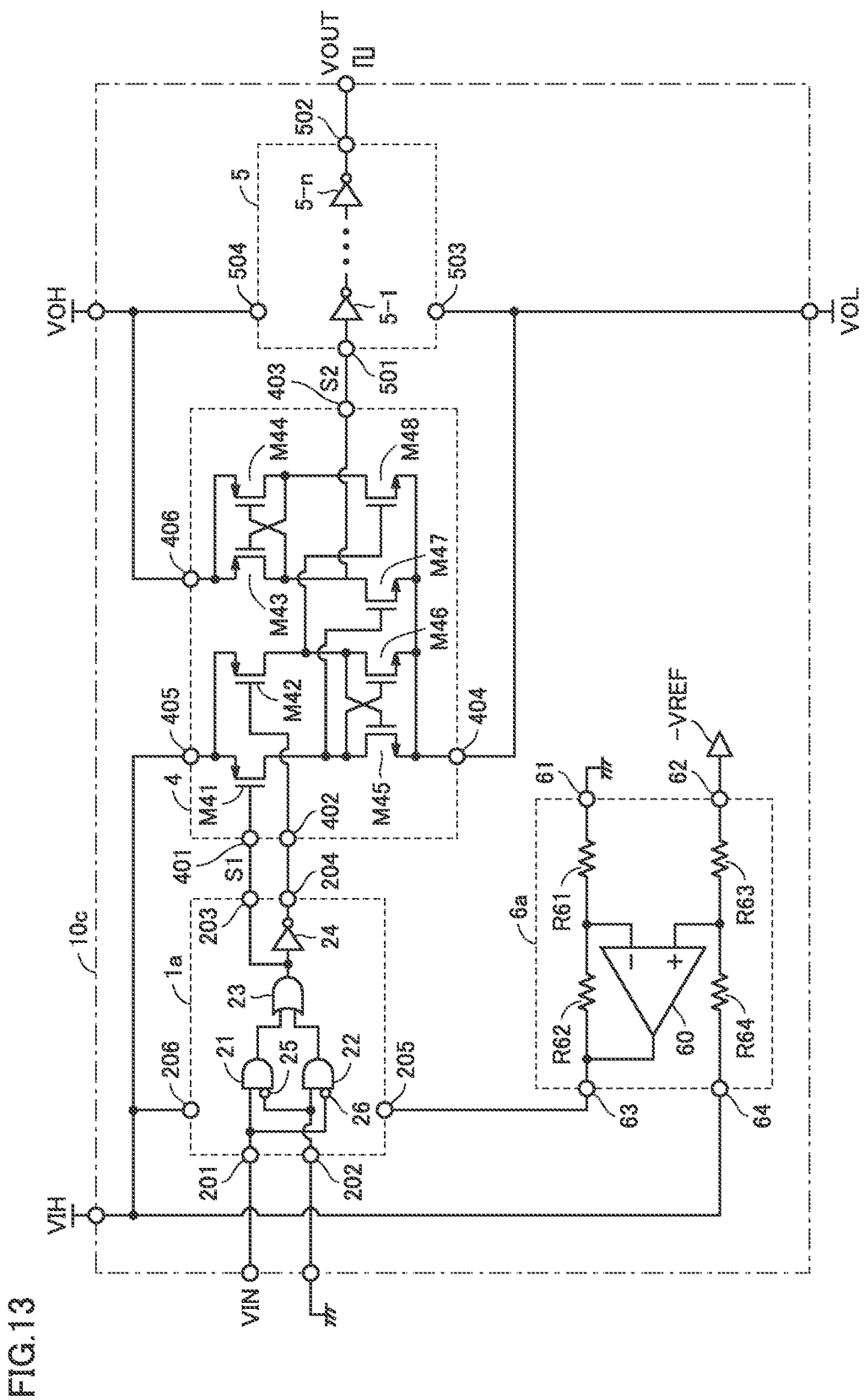
FIG. 13 is a circuit diagram showing an example of an interface circuit according to the third embodiment.

FIG. 13 is a circuit diagram showing an example of an interface circuit 10*c* according to the third embodiment. The example of interface circuit 10*c* shown in FIG. 13 is different from the example of interface circuit 10*a* shown in FIG. 5 in that it includes a voltage generator 6*a*.

Voltage generator 6*a* is a non-inverting amplifier including: an inverting input terminal 61; a first non-inverting input terminal 62; a second non-inverting input terminal 64; an output terminal 63; resistances R61, R62, R63 and R64; and an operational amplifier 60.

Inverting input terminal 61 is grounded and receives a GND potential. A constant potential—VREF (the second reference potential) is applied to first non-inverting input terminal 62. A high potential VIH of the input-side power supply is applied to second non-inverting input terminal 64.

Resistance R61 is connected between inverting input terminal 61 and the inverting input terminal of the operational amplifier. Resistance R62 has one terminal connected to the inverting input terminal of the operational amplifier, and the other terminal connected to output terminal 63 and the output terminal of the operational amplifier. Resistance R63 is connected between first non-inverting input terminal 62 and the non-inverting input terminal of the operational amplifier. Resistance R64 is connected between second non-inverting input terminal 64 and the non-inverting input terminal of the operational amplifier.

According to the above-described configuration, the non-inverting input terminal of the operational amplifier receives a potential $V_+$ that is obtained by dividing the voltage between high potential VIH and the second reference potential (−VREF) by resistance R63 and resistance R64. Voltage generator 6*a* functioning as a non-inverting amplifier outputs, through output terminal 63, a potential $V_O$ represented by the expression of $V_O=V_+\times(1+$(resistance value of R62)/(resistance value of R61)).

Constant potential–VREF and the resistance values of resistances R61, R62, R63, and R64 are set as appropriate such that the potential of output terminal 63 becomes approximately equal to low potential VIL.

Fourth Embodiment (Configuration of Interface Circuit)

Interface circuit 10b according to the above-described second embodiment operates in response to receipt of high potential VIH and low potential VIL from the input-side power supply. In contrast, the interface circuit according to the fourth embodiment receives low potential VIL from the input-side power supply to generate a high potential VIH_INT from low potential VIL inside thereof. Accordingly, it is not necessary to receive high potential VIH from the input-side power supply.

Figure 14:
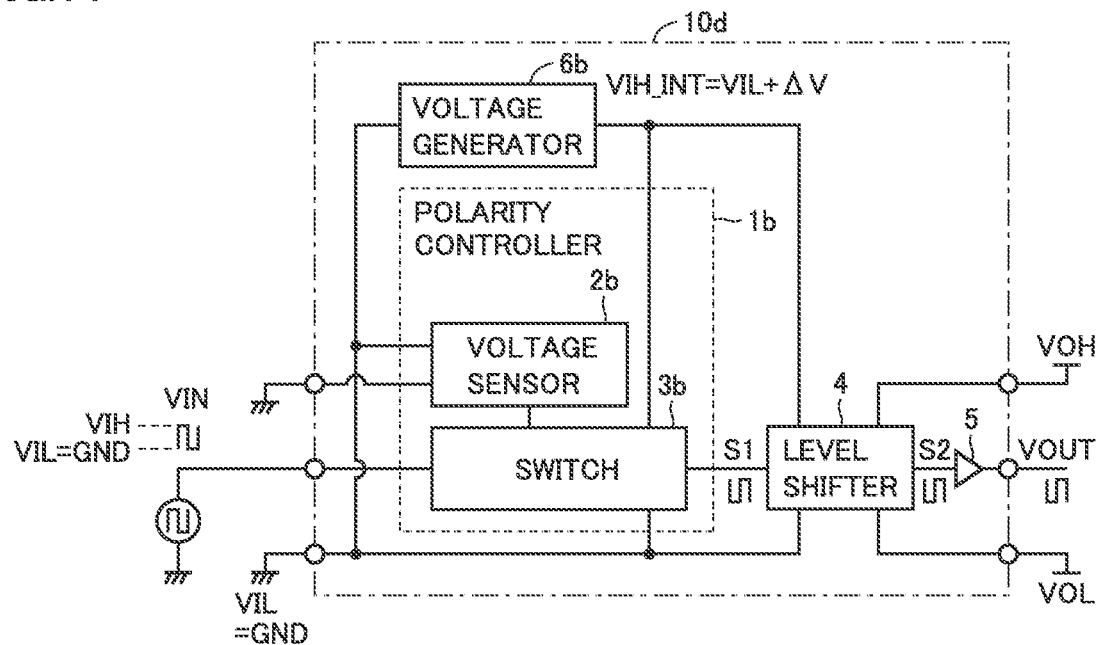
FIG. 14 is a circuit block diagram showing the configuration of an interface circuit according to the fourth embodiment, in the case where a signal having a high level defined as a positive potential and a low level defined as a GND potential is received as an input signal VIN.
Figure 15:
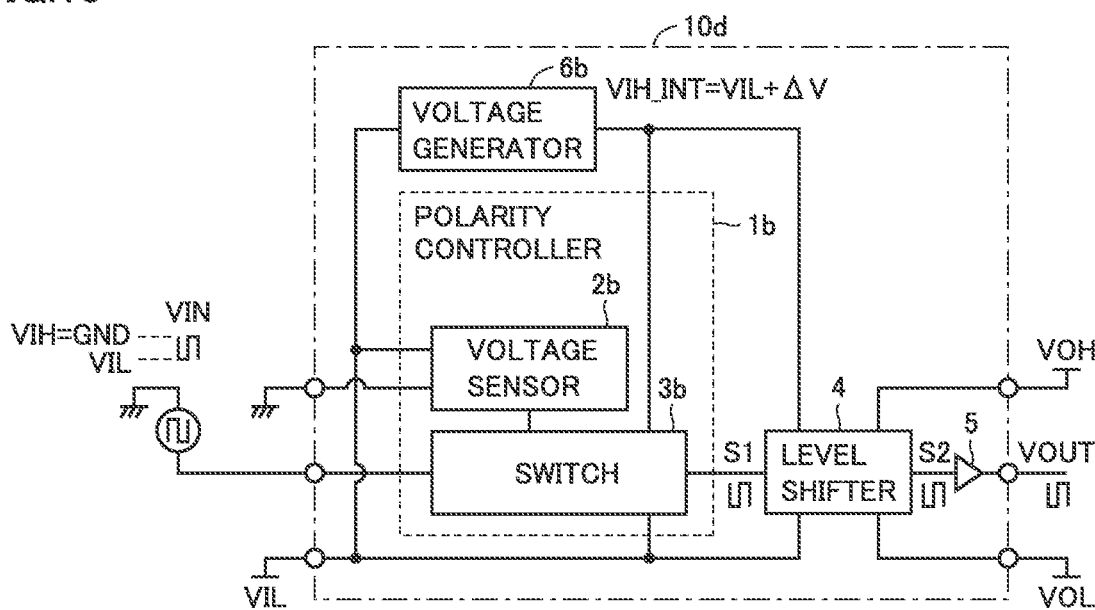
FIG. 15 is a circuit block diagram showing the configuration of the interface circuit according to the fourth embodiment, in the case where a signal having a high level defined as a GND potential and a low level defined as a negative potential is received as input signal VIN.

FIGS. 14 and 15 each are a circuit block diagram showing the configuration of an interface circuit 10d according to the forth embodiment. FIG. 14 shows the case of receiving, as input signal VIN, a high active signal having a high level (high potential VIH) as a positive potential and a low level (low potential VIL) as a reference potential (in this case, a GND potential) equivalent to inactive. FIG. 15 shows the case of receiving, as input signal VIN, a low active signal having a high level as a GND potential and a low level as a negative potential. The configuration of interface circuit 10b itself is the same in FIGS. 14 and 15.

Irrespective of whether the high level or the low level of input signal VIN is a GND potential, interface circuit 10d serves to output low active output signal VOUT, as in interface circuit 10b in the second embodiment. Accordingly, interface circuit 10d is applicable as a circuit that outputs an output signal VOUT to an element to be controlled that operates with a low active control signal.

As shown in FIGS. 14 and 15, interface circuit 10d is different from interface circuit 10b shown in each of FIGS. 7 and 8 in that it does not receive high potential VIH from the input-side power supply and includes a voltage generator 6b.

Voltage generator 6b generates a potential VIH_INT that is increased by a prescribed voltage ΔV from low potential VIL, and outputs generated potential VIH_INT to polarity controller 1b and level shifter 4 as a potential on the high potential side.

Voltage ΔV is approximately equal to the difference between high potential VIH and low potential VIL (VIH–VIL) of input signal VIN, and set at a voltage at which switching can be sufficiently achieved in polarity controller 1b and level shifter 4 that have received potential VIH_INT as a potential on the high potential side.

By the above-described configuration, low potential VIL is input into interface circuit 10d, but high potential VIH does not need to be input thereinto. Accordingly, the number of terminals in interface circuit 10d can be reduced, so that the substrate forming interface circuit 10d can be reduced in size.

(Example of Interface Circuit)

Figure 16:
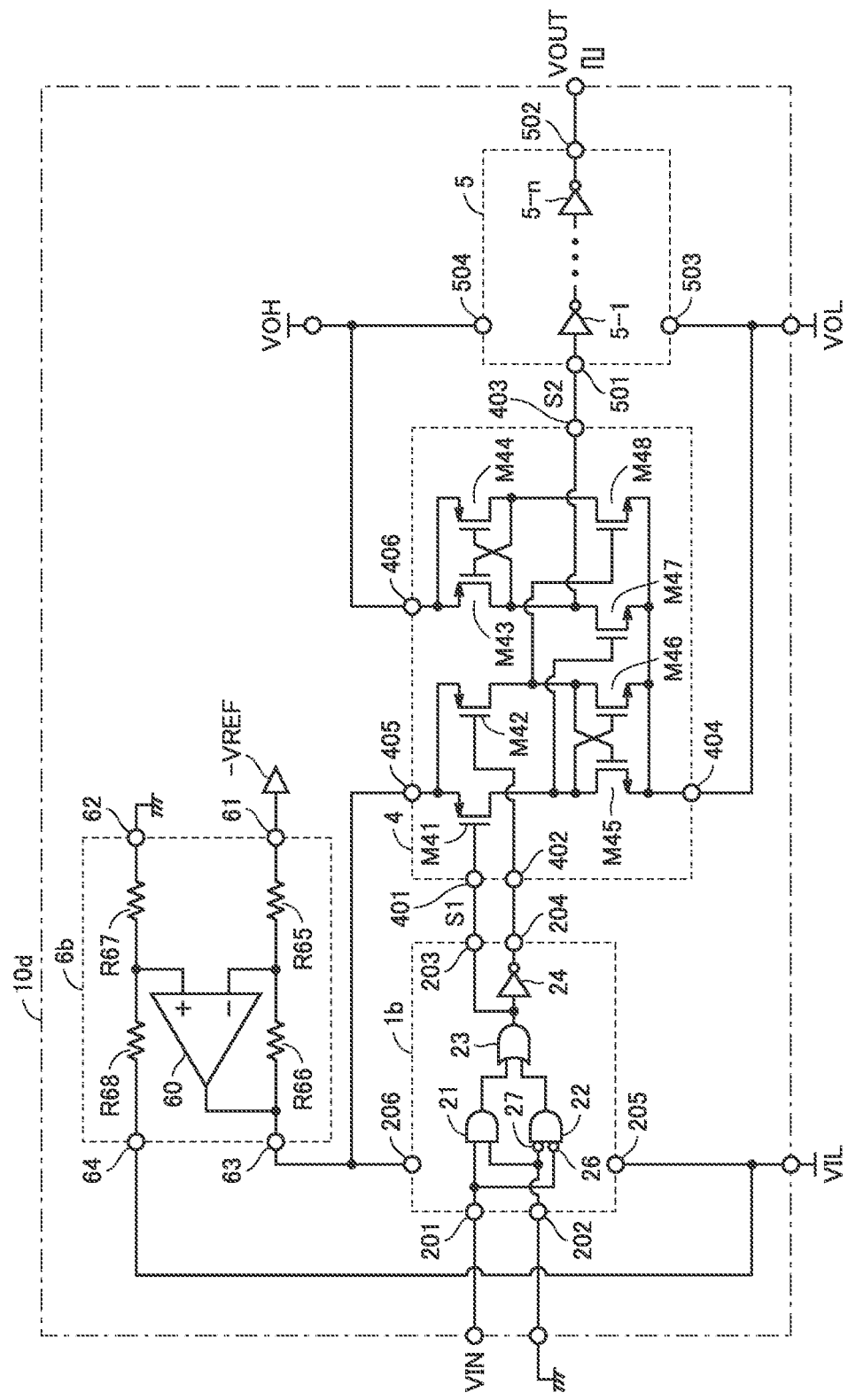
FIG. 16 is a circuit diagram showing an example of the interface circuit according to the fourth embodiment.

FIG. 16 is a circuit diagram showing an example of interface circuit 10d according to the fourth embodiment. The example of interface circuit 10d shown in FIG. 16 is different from the example of interface circuit 10b shown in FIG. 5 in that it includes a voltage generator 6b.

As shown in FIG. 16, voltage generator 6b is an inverting amplifier including: an inverting input terminal 61; a first non-inverting input terminal 62; a second non-inverting input terminal 64; an output terminal 63; resistances R65, R66, R67 and R68; and an operational amplifier 60, for example.

Inverting input terminal 61 receives a constant potential—VREF (the second reference potential). First non-inverting input terminal 62 is grounded, and receives a GND potential. Second non-inverting input terminal 64 receives a low potential VIL.

Resistance R65 is connected between inverting input terminal 61 and the inverting input terminal of the operational amplifier. Resistance R66 has one terminal connected to the inverting input terminal of the operational amplifier, and the other terminal connected to output terminal 63 and the output terminal of the operational amplifier. Resistance R67 is connected between first non-inverting input terminal 62 and the non-inverting input terminal of the operational amplifier. Resistance R68 is connected between second non-inverting input terminal 64 and the non-inverting input terminal of the operational amplifier.

According to the above-described configuration, the non-inverting input terminal of the operational amplifier receives a potential $V_+$ obtained by dividing the voltage between low potential VIL and the first reference potential (GND) by resistance R67 and resistance R68. Voltage generator 6b functioning as an inverting amplifier outputs, through output terminal 63, a potential $V_O$ represented by the expression of $V_O=V_+-($(resistance value of R66)/(resistance value of R65))$\times(-$VREF$-V_+)$.

Constant potential–VREF and the resistance values of resistances R65, R66, R67, and R68 are set as appropriate such that the potential of output terminal 63 becomes approximately equal to high potential VIH.

Modifications

Interface circuit 10a in the first embodiment shown in each of FIGS. 3 and 4 may include voltage sensor 2b shown in each of FIGS. 7 and 8 in place of voltage sensor 2a. In contrast, interface circuit 10b in the second embodiment shown in each of FIGS. 7 and 8 may include voltage sensor 2a shown in each of FIGS. 3 and 4 in place of voltage sensor 2b.

Furthermore, polarity controller 1a is not limited to the circuit configuration shown in FIG. 5. In other words, polarity controller 1a may be configured of a logic circuit (a logic circuit equivalent to that in FIG. 5) designed as appropriate such that (i) output signal S1 is in phase with input signal VIN when the GND potential corresponds to the low level of input signal VIN, and (ii) output signal S1 is reversed in polarity with respect to input signal VIN when the GND potential corresponds to the high level of input signal VIN.

Similarly, polarity controller 1b is not limited to the circuit configuration shown in FIG. 9. In other words, polarity controller 1b may be configured of a logic circuit (a logic circuit equivalent to that in FIG. 9) designed as appropriate such that (i) output signal S1 is in phase with input signal VIN when the GND potential corresponds to the high level of input signal VIN, and (ii) output signal S1 is reversed in polarity with respect to input signal VIN when the GND potential corresponds to the low level of input signal VIN.

Furthermore, polarity controller 1a may be configured of: a storage unit configured to store a program that (i) causes output signal S1 to be in phase with input signal VIN when the GND potential corresponds to the low level of input signal VIN and (ii) causes output signal S1 to be reversed in polarity with respect to input signal VIN when the GND potential corresponds to the high level of input signal VIN; and a processor that executes the program.

Similarly, polarity controller 1b may be configured of a storage unit configured to store a program that (i) causes output signal S1 to be in phase with input signal VIN when the GND potential corresponds to the high level of input signal VIN and (ii) causes output signal S1 to be reversed in polarity with respect to input signal VIN when the GND potential corresponds to the low level of input signal VIN; and a processor that executes the program.

Also in the above description, voltage sensor 2a is assumed to compare high potential VIH with the GND potential as a reference potential. However, voltage sensor 2a is not limited to this configuration, but may sense whether high potential VIH or low potential VIL is a GND potential, for example, by comparing the potential obtained by dividing high potential VIH with the GND potential.

Similarly, voltage sensor 2b may sense whether high potential VIH or low potential VIL is a GND potential, for example, by comparing the potential obtained by dividing low potential VIL with the GND potential.

Furthermore, assuming that the potential difference between high potential VIH and low potential VIL is defined as Vd, voltage sensor 2a may sense whether high potential VIH or low potential VIL is a GND potential, for example, by comparing high potential VIH with the comparative potential that is higher than the potential lower by Vd/2 than the GND potential and that is lower than the potential higher by Vd/2 than the GND potential. In this case, voltage sensor 2a may output a sensing signal showing that high potential VIH is a GND potential when the difference between high potential VIH and the comparative potential is smaller than Vd/2, and also may output a sensing signal showing that low potential VIL is a GND potential when the difference between high potential VIH and the comparative potential is equal to or greater than Vd/2.

Similarly, voltage sensor 2b may sense whether high potential VIH or low potential VIL is a GND potential, for example, by comparing low potential VIL with the comparative potential that is higher than the potential lower by Vd/2 than the GND potential and that is lower than the potential higher by Vd/2 than the GND potential. In this case, voltage sensor 2b may output a sensing signal showing that low potential VIL is a GND potential when the difference between low potential VIL and the comparative potential is smaller than Vd/2, and also may output a sensing signal showing that high potential VIH is a GND potential when the difference between low potential VIL and the comparative potential is equal to or greater than Vd/2.

Furthermore, level shifter 4 is not limited to the circuit configuration shown in FIG. 5. Level shifter 4 may be configured of a plurality of logic circuits that are designed as appropriate to output signal S2 of high potential VOH when input signal S1 is at a high level, and to output signal S2 of low potential VOL when signal S1 is at a low level.

Figure 17:
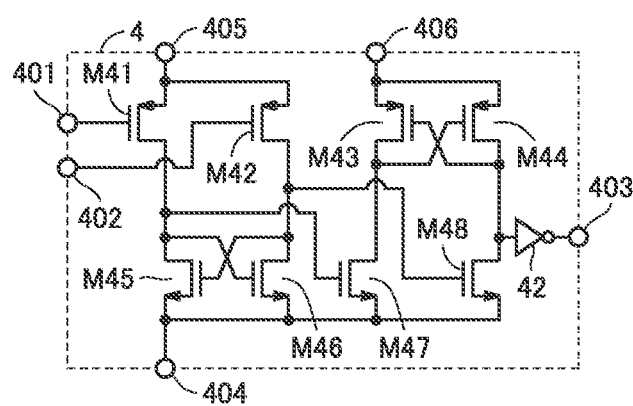
FIG. 17 is a diagram showing another circuit configuration of a level shifter.

FIG. 17 is a diagram showing another circuit configuration of level shifter 4. Level shifter 4 shown in FIG. 17 is different from level shifter 4 shown in FIG. 5 in that output terminal 403 is not connected to the drains of PMOS transistor M43 and NMOS transistor M47 but connected to the drains of PMOS transistor M44 and NMOS transistor M48 through inverter 42.

As described above, when the potentials at the drains of PMOS transistor M44 and NMOS transistor M48 each are high potential VOH, the potentials at the drains of PMOS transistor M43 and NMOS transistor M47 each are low potential VOL. Furthermore, when the potentials at the drains of PMOS transistor M44 and NMOS transistor M48 each are low potential VOL, the potentials at the drains of PMOS transistor M43 and NMOS transistor M47 each are high potential VOH. Accordingly, also in the circuit configuration in FIG. 17, level shifter 4 can output signal S2 of high potential VOH when input signal S1 is at a high level, and can output signal S2 of low potential VOL when signal S1 is at a low level.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1a, 1b polarity controller, 2a, 2b voltage sensor, 3a, 3b switch, 4 level shifter, 25 to 27 inverter, 5 output buffer, 6a, 6b voltage generator, 10a to 10d interface circuit, 21, 22 AND circuit, 23 OR circuit, 60 operational amplifier, 61 inverting input terminal, 62 first non-inverting input terminal, 63 output terminal, 64 second non-inverting input terminal, M41 to M44 PMOS transistor, M45 to M48 NMOS transistor, R61 to R68 resistance.

The invention claimed is:

1. An interface circuit for (i) receiving a first signal that has a high level defined as a first potential and a low level defined as a second potential lower than the first potential, and (ii) generating a single second signal that has a high level defined as a third potential and a low level defined as a fourth potential lower than the third potential, the interface circuit being configurable in a high active control configuration or in a low active control configuration, based on whether the first potential or the second potential corresponds to a first reference potential equivalent to inactive, the interface circuit comprising:
  a controller configured to:
    control the single second signal to be in phase with the first signal (i) when the first potential, in the low active control configuration, is the first reference potential, or (ii) when the second potential, in the high active control configuration, is the first reference potential, and
    control the single second signal to be reversed in polarity with respect to the first signal (i) when the first potential, in the high active control configuration, is the first reference potential, or (ii) when the second potential, in the low active control configuration, is the first reference potential.

2. The interface circuit according to claim 1, wherein the controller is configured to
  output a signal in phase with the first signal as a third signal when the second potential is the first reference potential, and
  output a signal reversed in polarity with respect to the first signal as the third signal when the first potential is the first reference potential, and
the interface circuit further comprises a level shifter configured to
  receive the third signal, and generate, as the single second signal, a signal that is in phase with the third signal and that has a high level defined as the third potential and a low level defined as the fourth potential.

3. The interface circuit according to claim 2, further comprising a buffer configured to perform current-amplification of the single second signal to output the single second signal from the interface circuit.

4. The interface circuit according to claim 2, wherein
the controller includes a voltage sensor configured to compare a comparative potential with the first potential or a potential obtained by dividing the first potential, to generate a control signal showing whether the first potential or the second potential is the first reference potential,
the comparative potential is
   higher than a potential lower than the first reference potential by half a potential difference between the first potential and the second potential, and
   lower than a potential higher than the first reference potential by half the potential difference, and
the controller further includes a switch configured to switch the third signal to be in phase with the first signal or to be reversed in polarity, according to the control signal.

5. The interface circuit according to claim 2, wherein
the controller includes a voltage sensor configured to compare a comparative potential with the second potential or a potential obtained by dividing the second potential, to generate a control signal showing whether the first potential or the second potential is the first reference potential,
the comparative potential is
   higher than a potential lower than the first reference potential by half a potential difference between the first potential and the second potential, and
   lower than a potential higher than the first reference potential by half the potential difference, and
the controller further includes a switch configured to switch the third signal to be in phase with the first signal or to be reversed in polarity, according to the control signal.

6. The interface circuit according to claim 2, wherein
the controller includes a first AND circuit, a second AND circuit, an OR circuit, a first inverter, and a second inverter,
the first AND circuit is configured to
   receive the first signal, and
   receive the first reference potential through the first inverter,
the second AND circuit is configured to
   receive the first signal through the second inverter, and
   receive the first reference potential, and
the OR circuit is configured to
   receive an output from the first AND circuit and an output from the second AND circuit, and
   output the third signal.

7. The interface circuit according to claim 2, wherein
the level shifter includes
   a first PMOS transistor, a second PMOS transistor, a third PMOS transistor, and a fourth PMOS transistor, and
   a first NMOS transistor, a second NMOS transistor, a third NMOS transistor, and a fourth NMOS transistor,
the first PMOS transistor has
   a gate receiving the third signal, and
   a source receiving the first potential,
the second PMOS transistor has
   a gate receiving a signal inverted from the third signal, and
   a source receiving the first potential,
the first NMOS transistor has
   a gate connected to a drain of the second NMOS transistor, and
   a source receiving the fourth potential,
the second NMOS transistor has
   a gate connected to a drain of the first NMOS transistor, and
   a source receiving the fourth potential,
the first PMOS transistor has a drain connected to the drain of the first NMOS transistor,
the second PMOS transistor has a drain connected to the drain of the second NMOS transistor,
the third PMOS transistor has
   a gate connected to a drain of the fourth PMOS transistor, and
   a source receiving the third potential,
the fourth PMOS transistor has
   a gate connected to a drain of the third PMOS transistor, and
   a source receiving the third potential,
the third NMOS transistor has
   a gate connected to the drains of the first PMOS transistor and the first NMOS transistor, and
   a source receiving the fourth potential,
the fourth NMOS transistor has
   a gate connected to the drains of the second PMOS transistor and the second NMOS transistor, and
   a source receiving the fourth potential,
the third NMOS transistor has a drain connected to the drain of the third PMOS transistor,
the fourth NMOS transistor has a drain connected to the drain of the fourth PMOS transistor, and
the level shifter is configured to generate, as the single second signal, (i) a signal of a potential state at each of the drains of the third PMOS transistor and the third NMOS transistor, or (ii) a signal of the potential state inverted at each of the drains of the fourth PMOS transistor and the fourth NMOS transistor.

8. The interface circuit according to claim 2, further comprising a voltage generator configured to
receive the first potential from a power supply, and
generate a potential lower by a prescribed voltage than the first potential as the second potential, wherein
the controller is configured to generate the third signal based on the first potential received from the power supply and the second potential generated by the voltage generator.

9. The interface circuit according to claim 8, wherein
the voltage generator includes a first resistance, a second resistance, a third resistance, a fourth resistance, and an operational amplifier,
the first resistance is connected between a terminal into which the first reference potential is input and an inverting input terminal of the operational amplifier,
the second resistance is connected between the inverting input terminal of the operational amplifier and an output terminal of the operational amplifier,
the third resistance is connected between a terminal into which a second reference potential is input and a non-inverting input terminal of the operational amplifier, the fourth resistance is connected between the non-inverting input terminal of the operational amplifier and a terminal into which the first potential from the power supply is input, the first resistance, the second resistance, the third resistance, and the fourth resistance have resistance values, and the resistance values and the second reference potential are set such that a potential output from the output terminal of the operational amplifier is equal to the second potential.

10. The interface circuit according to claim 2, further comprising a voltage generator configured to receive the second potential from a power supply, and generate a potential higher by a prescribed voltage than the second potential as the first potential, wherein the controller is configured to generate the third signal based on the second potential received from the power supply and the first potential generated by the voltage generator.

11. The interface circuit according to claim 10, wherein the voltage generator includes a first resistance, a second resistance, a third resistance, a fourth resistance, and an operational amplifier, the first resistance is connected between a terminal into which a second reference potential is input and an inverting input terminal of the operational amplifier, the second resistance is connected between the inverting input terminal of the operational amplifier and an output terminal of the operational amplifier, the third resistance is connected between a terminal into which the first reference potential is input and a non-inverting input terminal of the operational amplifier, the fourth resistance is connected between the non-inverting input terminal of the operational amplifier and a terminal into which the second potential from the power supply is input, the first resistance, the second resistance, the third resistance, and the fourth resistance have resistance values, and the resistance values and the second reference potential are set such that a potential output from the output terminal of the operational amplifier is equal to the first potential.

12. The interface circuit according to claim 1, wherein the controller is configured to output a signal reversed in polarity with respect to the first signal as a third signal when the second potential is the first reference potential, and output a signal in phase with the first signal as the third signal when the first potential is the first reference potential, and the interface circuit further comprises a level shifter configured to receive the third signal and generate, as the single second signal, a signal that is in phase with the third signal and that has a high level defined as the third potential and a low level defined as the fourth potential.

13. The interface circuit according to claim 12, wherein the controller includes a first AND circuit, a second AND circuit, an OR circuit, a first inverter, and a second inverter, the first AND circuit is configured to receive the first signal, and receive the first reference potential, the second AND circuit is configured to receive the first signal through the first inverter, and receive the first reference potential through the second inverter, and the OR circuit is configured to receive an output from the first AND circuit and an output from the second AND circuit, and output the third signal.

14. The interface circuit according to claim 12, further comprising a buffer configured to perform current-amplification of the single second signal to output the single second signal from the interface circuit.

15. The interface circuit according to claim 12, wherein the controller includes a voltage sensor configured to compare a comparative potential with the first potential or a potential obtained by dividing the first potential, to generate a control signal showing whether the first potential or the second potential is the first reference potential, the comparative potential is higher than a potential lower than the first reference potential by half a potential difference between the first potential and the second potential, and lower than a potential higher than the first reference potential by half the potential difference, and the controller further includes a switch configured to switch the third signal to be in phase with the first signal or to be reversed in polarity, according to the control signal.

16. The interface circuit according to claim 12, wherein the controller includes a voltage sensor configured to compare a comparative potential with the second potential or a potential obtained by dividing the second potential, to generate a control signal showing whether the first potential or the second potential is the first reference potential, the comparative potential is higher than a potential lower than the first reference potential by half a potential difference between the first potential and the second potential, and lower than a potential higher than the first reference potential by half the potential difference, and the controller further includes a switch configured to switch the third signal to be in phase with the first signal or to be reversed in polarity, according to the control signal.

17. The interface circuit according to claim 12, wherein the level shifter includes a first PMOS transistor, a second PMOS transistor, a third PMOS transistor, and a fourth PMOS transistor, and a first NMOS transistor, a second NMOS transistor, a third NMOS transistor, and a fourth NMOS transistor, the first PMOS transistor has a gate receiving the third signal, and a source receiving the first potential, the second PMOS transistor has a gate receiving a signal inverted from the third signal, and a source receiving the first potential, the first NMOS transistor has a gate connected to a drain of the second NMOS transistor, and a source receiving the fourth potential, the second NMOS transistor has a gate connected to a drain of the first NMOS transistor, and a source receiving the fourth potential,
the first PMOS transistor has a drain connected to the drain of the first NMOS transistor,
the second PMOS transistor has a drain connected to the drain of the second NMOS transistor,
the third PMOS transistor has
  a gate connected to a drain of the fourth PMOS transistor, and
  a source receiving the third potential,
the fourth PMOS transistor has
  a gate connected to a drain of the third PMOS transistor, and
  a source receiving the third potential,
the third NMOS transistor has
  a gate connected to the drains of the first PMOS transistor and the first NMOS transistor, and
  a source receiving the fourth potential,
the fourth NMOS transistor has
  a gate connected to the drains of the second PMOS transistor and the second NMOS transistor, and
  a source receiving the fourth potential,
the third NMOS transistor has a drain connected to the drain of the third PMOS transistor,
the fourth NMOS transistor has a drain connected to the drain of the fourth PMOS transistor, and
the level shifter is configured to generate, as the single second signal, (i) a signal of a potential state at each of the drains of the third PMOS transistor and the third NMOS transistor, or (ii) a signal of the potential state inverted at each of the drains of the fourth PMOS transistor and the fourth NMOS transistor.

18. The interface circuit according to claim 12, further comprising a voltage generator configured to
  receive the first potential from a power supply, and
  generate a potential lower by a prescribed voltage than the first potential as the second potential, wherein
  the controller is configured to generate the third signal based on the first potential received from the power supply and the second potential generated by the voltage generator.

19. The interface circuit according to claim 18, wherein
the voltage generator includes a first resistance, a second resistance, a third resistance, a fourth resistance, and an operational amplifier,
the first resistance is connected between a terminal into which the first reference potential is input and an inverting input terminal of the operational amplifier,
the second resistance is connected between the inverting input terminal of the operational amplifier and an output terminal of the operational amplifier,
the third resistance is connected between a terminal into which a second reference potential is input and a non-inverting input terminal of the operational amplifier,
the fourth resistance is connected between the non-inverting input terminal of the operational amplifier and a terminal into which the first potential from the power supply is input,
the first resistance, the second resistance, the third resistance, and the fourth resistance have resistance values, and
the resistance values and the second reference potential are set such that a potential output from the output terminal of the operational amplifier is equal to the second potential.

20. The interface circuit according to claim 12, further comprising a voltage generator configured to
  receive the second potential from a power supply, and
  generate a potential higher by a prescribed voltage than the second potential as the first potential, wherein
  the controller is configured to generate the third signal based on the second potential received from the power supply and the first potential generated by the voltage generator.

21. The interface circuit according to claim 20, wherein
the voltage generator includes a first resistance, a second resistance, a third resistance, a fourth resistance, and an operational amplifier,
the first resistance is connected between a terminal into which a second reference potential is input and an inverting input terminal of the operational amplifier,
the second resistance is connected between the inverting input terminal of the operational amplifier and an output terminal of the operational amplifier,
the third resistance is connected between a terminal into which the first reference potential is input and a non-inverting input terminal of the operational amplifier,
the fourth resistance is connected between the non-inverting input terminal of the operational amplifier and a terminal into which the second potential from the power supply is input,
the first resistance, the second resistance, the third resistance, and the fourth resistance have resistance values, and
the resistance values and the second reference potential are set such that a potential output from the output terminal of the operational amplifier is equal to the first potential.

* * * * *